(12) United States Patent
Detofsky et al.

(10) Patent No.: US 9,506,980 B2
(45) Date of Patent: Nov. 29, 2016

(54) INTEGRATED CIRCUIT TESTING ARCHITECTURE

(71) Applicants: Abram M. Detofsky, Tigard, OR (US); Brett D. Grossman, Forest Grove, OR (US); Jin Pan, Portland, OR (US); John M. Peterson, Hillsboro, OR (US); Ronald K. Minemier, Tempe, AZ (US)

(72) Inventors: Abram M. Detofsky, Tigard, OR (US); Brett D. Grossman, Forest Grove, OR (US); Jin Pan, Portland, OR (US); John M. Peterson, Hillsboro, OR (US); Ronald K. Minemier, Tempe, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 57 days.

(21) Appl. No.: 13/843,565

(22) Filed: Mar. 15, 2013

(65) Prior Publication Data
US 2014/0266285 A1 Sep. 18, 2014

(51) Int. Cl.
*G01R 31/317* (2006.01)
*G01R 31/28* (2006.01)

(52) U.S. Cl.
CPC ..... *G01R 31/31724* (2013.01); *G01R 31/2889* (2013.01); *G01R 31/2834* (2013.01); *G01R 31/2844* (2013.01)

(58) Field of Classification Search
CPC .............. G01R 31/31724; G01R 31/2889; G01R 31/2834; G01R 31/2844; G01R 31/2866; G01R 1/0483; G01R 1/0408; G01R 1/07307
See application file for complete search history.

(56) References Cited

U.S. PATENT DOCUMENTS

| | | | | |
|---|---|---|---|---|
| 4,528,504 A | * | 7/1985 | Thornton, Jr. | G01R 1/18 324/750.03 |
| 5,519,331 A | * | 5/1996 | Cowart et al. | 324/756.02 |
| 5,757,201 A | * | 5/1998 | Partridge | G01R 31/2886 324/756.02 |
| 2002/0118007 A1 | * | 8/2002 | Mori et al. | 324/158.1 |
| 2003/0197521 A1 | * | 10/2003 | Weimer | G01R 1/07378 324/756.07 |
| 2009/0267628 A1 | * | 10/2009 | Takase | G01R 31/31905 324/763.01 |
| 2010/0117673 A1 | * | 5/2010 | Lee et al. | 324/761 |
| 2014/0213077 A1 | * | 7/2014 | Ma | H05K 3/306 439/74 |

OTHER PUBLICATIONS siliconfareast.com, "ATE Load Boards/DUT Boards/Interface Boards", [online], © 2005, [Retrieved on Feb. 21, 2013], retrieved from the Internet at <URL: http://www.siliconfareast.com/loadbrds.htm>, 2 pp.

* cited by examiner

*Primary Examiner* — Melissa Koval
*Assistant Examiner* — Felicia Farrow
(74) *Attorney, Agent, or Firm* — Konrad Raynes Davda & Victor LLP

(57) ABSTRACT

In accordance with one aspect of the present description, an interface between an integrated circuit device and a test controller for testing the integrated circuit device includes a plurality of boards coupled together. In one embodiment, the test interface includes a plurality of interchangeable auxiliary boards, each having test circuitry, which may be coupled to a primary board and reused as appropriate to test various integrated circuits. Other aspects are described.

22 Claims, 8 Drawing Sheets

INTEGRATED CIRCUIT TESTING ARCHITECTURE

BACKGROUND

Description of Related Art

Integrated circuits typically include various active and passive circuit elements which have been integrated into a piece or substrate of semiconductor material, often referred to as a die. The die may, in turn, be fully or partially encapsulated into a package, which often includes a ceramic or plastic substrate although other materials may be used. The package mechanically supports and protects the die which is often relatively fragile.

These packages are usually attached to a printed circuit board through their second level interconnects, which often are pins, balls or other connectors arranged along the exterior of the package. The package may be attached directly to the printed circuit board, often by soldering or other connection techniques. In some applications, the package may not connect directly to the printed circuit board. Instead, an interposer or socket or other device may provide an intermediate connection between the package and the printed circuit board.

Conductors of the package typically provide separate electrical connection terminals between the printed circuit board (or interposer or socket), and the various inputs and outputs of the integrated circuit or circuits within the package. An integrated circuit die often has electrical connectors such as solder bumps to mechanically and electrically connect the integrated circuit die to the package substrate. Solder bumps or other electrical connectors may also be used to mechanically and electrically connect an integrated circuit die to one or more other such dies in a stack arrangement. In this manner, an electronic system can be formed by connecting various integrated circuit dies to a printed circuit board.

Before it is shipped, a product such as an integrated circuit device may be tested by plugging the product into a test socket of a test board of a testing system. Thus, the socket frequently provides both a mechanical coupling which secures the device under test to the test board, and an electrical coupling to permit electrical signals to pass between the product and the test board.

A programmed test controller often referred to as a "tester" conducts the test of the product by generating test signals which are directed to the device under test by the test board which is plugged into a connector of the test controller. The test signals typically include test excitation signals which are routed by the test board to the device under test. A test excitation signal may include a data signal, an address signal, a control signal, a power signal, a ground signal, etc. In response to the test excitation signals, the product generates test response signals which are often routed by the test board back to the test controller for storage and analysis.

As the integrated circuit devices have grown more complex, the test board for testing a device has correspondingly grown more complex. In addition to dedicated conductors which pass through test signals from the test controller to the device socket unchanged or substantially unchanged, the test board frequently has complex switching circuitry on board to switch both analog and digital test signals from the test controller over various conductors of the test board to individual pins or connectors of the device socket on the test board. Thus, a test excitation signal may be routed to a first socket pin and then routed to a different socket pin, depending upon the particular test being conducted. Similarly, test response signals from one pin of the device socket may be routed to a particular input of the test controller and then test response signals from a different pin of the device socket may be routed to the same input of the test controller, depending upon the particular test being conducted.

A test board may also have complex logic circuitry on board for generating test excitation signals in response to a test excitation signal from the test controller. The test excitations signals generated on board the test board may include complex bit patterns and complex timing sequences of multiple excitation signals which are routed to the device socket on the test board. The logic circuitry on board the test board may also receive test response signals from the device under test and store and analyze the test response signals. For example, the logic circuitry on board the test board may analyze the test response signals from the device under test and provide a pass/fail test response signal to the test controller. Other examples of circuitry on board a test board may include switches and amplifiers.

A test board is typically custom designed for a particular device under test. If the design of a product changes, a new test board is frequently designed and fabricated for testing that new product. Once a product is discontinued, the test board for that product is frequently discarded.

Before an integrated circuit die is placed in a package or in a stack of dies, the die is often tested. A process in which a die on a wafer is tested is commonly referred to as "wafer sort." Wafer sort testing typically involves the use of probing technology wherein mechanical probes extending from a probe card engage electrical contact features on a die, and connect the contact features to a tester of a testing apparatus. During testing, a handler is frequently used to support the wafer on a platform or chuck and positions the wafer so as to precisely align the die bumps, bond pads or other electrical contact features of a die to be tested with the probe features on the probe card.

To activate the circuitry on the die, power signals including voltage and ground signals, and input signals including control, address, clock and data signals are supplied to die bumps, bond pads or other electrical contact features of a die which may be positioned on the front side, back side, or both sides of the device. Signals generated by the integrated circuit device in response to the supplied signals may be received by probes of the probe card and may be recorded and analyzed by the tester.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

Figure 1:
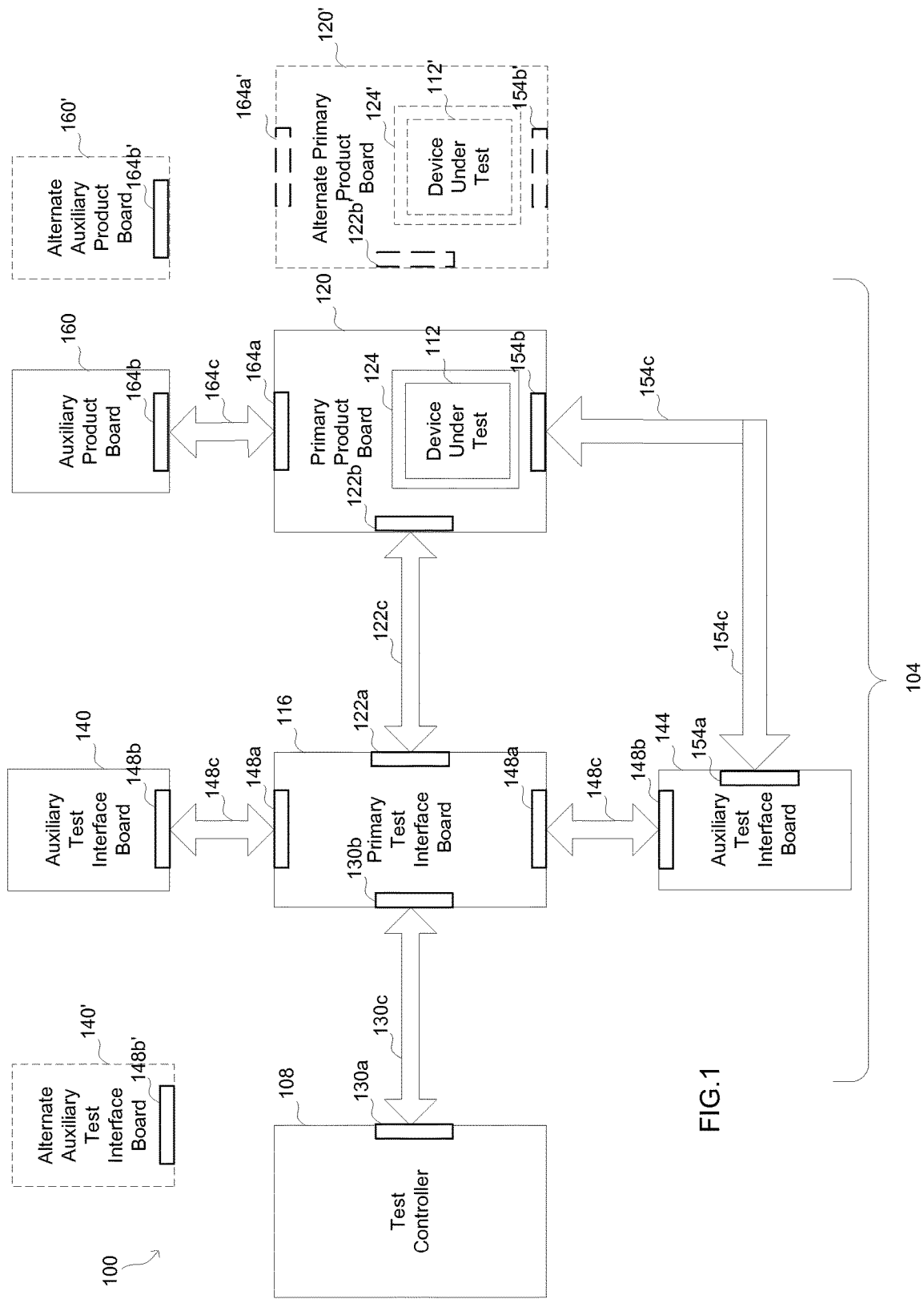
FIG. 1 illustrates one embodiment of a system having a test interface for testing integrated circuit devices in accordance with the present description.

In the following description, reference is made to the accompanying drawings which form a part hereof and which illustrate several embodiments of the present disclosure. It is understood that other embodiments may be utilized and structural and operational changes may be made without departing from the scope of the present description.

In accordance with one aspect of the present description, a test interface between a test controller of a tester system, and an integrated circuit device under test, includes a primary test interface board coupled to a primary product board for carrying the integrated circuit device under test. In one embodiment, the primary product board has a socket to which the device under test is coupled. To test a second product different from the first product using the tester system, a second product board having a different socket compatible with the second product may be substituted for the first product board if the socket or other circuitry of the first product board is not compatible with the second product. However, the test circuitry of the primary interface board may be designed to be compatible with either product board and thus may be used to test different products with the appropriate product board. It is appreciated that in some embodiments, an interface in accordance with the present description, between a test controller of a tester system, and an integrated circuit device under test, may have more than one primary product board coupled to the primary test interface board.

In accordance with another aspect of the present description, the interface between a test controller of a tester system, and an integrated circuit device under test, may include an auxiliary test interface board coupled to a primary test interface board. In one embodiment, the auxiliary test interface board has specialized test circuitry compatible with the device under test. To test a second product different from the first product using the tester system, a second auxiliary test interface board having different specialized test circuitry compatible with the second product may be substituted for the first auxiliary test interface board if the specialized test circuitry of the first auxiliary test interface board is not compatible with the second product. However, the circuitry of the primary interface board may be designed to be compatible with either auxiliary test interface board and thus may be used to test different products with the appropriate auxiliary test interface board. It is appreciated that in some embodiments, a test interface, in accordance with the present description, between a test controller of a tester system, and an integrated circuit device under test, may have more than one auxiliary test interface board coupled to the primary test interface board, or may omit having an auxiliary test interface board coupled to the primary test interface board.

In accordance with another aspect of the present description, the test interface between a test controller of a tester system, and an integrated circuit device under test, may include an auxiliary product board coupled to a primary product board. In one embodiment, the auxiliary product board has specialized test circuitry compatible the device under test. To test a second product different from the first product using the tester system, a second auxiliary product board having different specialized test circuitry compatible with the second product may be substituted for the first auxiliary product board if the specialized test circuitry of the first auxiliary product board is not compatible with the second product. However, the circuitry of the primary product board may be designed to be compatible with either auxiliary product board and thus may be used to test different products with the appropriate auxiliary product board. It is appreciated that in some embodiments, a test interface in accordance with the present description, between a test controller of a tester system, and an integrated circuit device under test, may have more than one auxiliary product board coupled to the primary product board, or may omit having an auxiliary product board coupled to the primary product board.

FIG. 1 depicts one example of an automated testing system 100 in accordance with one embodiment of the present description. The system 100 includes a test interface 104 between a tester or test controller 108 of the testing system 100, and an integrated circuit device 112 under test. In one aspect of the present description, the test interface 104 includes a primary test interface board 116 coupled to a primary product board 120 for carrying the integrated circuit device 112 under test. In this example, the primary test interface board 116 is coupled to the primary product board 120 by board connectors 122a, 122b disposed on the boards 115, 120, respectively. As a consequence, the primary product board 120 may be readily connected to the primary test interface board by connecting the board connectors 122a and 122b, using the signal paths 122c, to add the primary product board 120 to the test system 100. Similarly, the primary product board 120 may be readily disconnected from the primary test interface board 116 by disconnecting the board connectors 122a and 122b, to remove the primary product board 120 from the test system 100, to allow the substitution of a substitute primary product board 120', as appropriate to the particular device 112 to be tested.

In the illustrated embodiments, board connectors, such as the board connectors 122a, 122b, for example, for connecting boards together, may be electrically coupled together by signal paths such as signal paths 122c, for example, which may be provided by electrical contacts, wires or other signal conductors when the board connectors are physically mated together. In other embodiments, the signal paths may be provided by cables such as flex cables, optical cables or other cables capable of conducting signals, such that the board connectors may be spaced apart yet electrically coupled together by the signal paths. Thus, the board connectors 122a, 122b may be either physically mated together or may be physically separate, yet electrically coupled together by signal paths 122c.

In the illustrated embodiment, the device 112 under test may be any digital or analog integrated circuit such as a microprocessor, memory, input/output circuit, graphics processor, photodetector, gate array, controller, signal processor, etc. In one embodiment, the primary product board 120 has a socket 124 to which the device 112 under test is coupled. The socket 124 may be affixed to the primary product board 120, and provides a mechanical coupling between the device 112 under test and the primary product board 120 to secure the device 112 to the primary product board 120. For example, a male shaped body portion of the exterior package of the device 112 may be received in a female shaped cavity of the socket 124. In some applications, fasteners or clamps may be used to further secure the device 112 within the socket 124. Other types of mechanical couplers may be used to securely couple the device 112 to the socket 124 of the primary product board 120.

In addition, the socket 124 provides an electrical coupling of the device 112 to circuitry on the primary product board 120. For example, the device 112 may have electrical signal contacts such as electrically conductive pins which are received by appropriately shaped electrical contacts in the socket 124. Other types of electrical contacts such as electrically conductive balls or pads may also be used, depending upon the particular application.

Accordingly, the socket 124 and the device 112 of the illustrated embodiment are designed to be compatible with each other both mechanically and electrically. Thus, if another device 112' is to be tested, and that other device 112' is not compatible with the socket 124, the product board 120 may be readily disconnected from the primary test interface board 116 to remove the primary product board 120 from the test system 100. Further, a different primary product board 120' having a socket 124' compatible with the other device 112' may be substituted to add the different primary product board 120' to the test system 100, and thereby substitute a different primary product board 120', as appropriate to the particular device 112, 112' to be tested.

In the system 100, the test controller 108 generates test signals including test excitation signals for testing the device 112 under test. In addition, the test controller receives test signals including test response signals in response to those tests. The test controller 108 is coupled to the primary test interface board 116 by board connectors 130a and 130b of the test controller 108 and the primary test interface board 116, respectively. Signal paths 130c electrically couple each board connector 130a to a corresponding board connector 130b.

In the illustrated embodiment, one function of the primary test interface board 116 is to pass test excitation signals from the test controller 108 to the particular primary product board 120, 122' which is connected to the primary test interface board 116. Similarly, another function of the primary test interface board 116 is to pass test response signals from the particular primary product board 120, 122' which is connected to the primary test interface board 116, back to the test controller 108. Accordingly, the circuitry of the primary test interface board 116 may include pass through circuitry which passes test excitation and response signals between the board connectors 130b and 122a of the primary test interface board 116.

Similarly, in the illustrated embodiment, one function of the particular primary product board 120, 122' which is connected to the primary test interface board 116, is to pass test excitation signals from the primary test interface board 116 to the socket of the particular primary product board 120, 122'. Further, another function of the particular primary product board 120, 122' which is connected to the primary test interface board 116, is to pass test response signals from the socket of the particular primary product board 120, 122' back to the primary test interface board 116. Accordingly, the circuitry of each primary product board 120, 120' may include pass through circuitry which passes test excitation and response signals between the socket of the particular primary product board 120, 120', and the board connector 122, 122b' of the primary product board 120, 120b'. Bulk decoupling may also be provided.

In the illustrated embodiment, the primary product board 120 and the alternate primary product board 120' each have board connectors 122b, 122b', respectively, which are compatible with the board connector 122a of the primary test interface board 116. Accordingly, the mechanical and electrical couplers of the board connectors 122b and 122b' are compatible with the mechanical and electrical couplers of the board connector 122a of the primary test interface board 116. As a result, the primary product board 120 and the alternate primary product board 120' are interchangeably connectable to the primary interface board 116.

Further, the pass through circuitry of the primary test interface board 116 permits the appropriate test excitation and response signals to pass between the board connectors 130b and 122a of the primary test interface board 116, depending upon which primary product board 120, 120' is connected to the primary test interface board 116. The pass through circuitry of each primary product board 120, 120' is compatible with the pass through circuitry of the primary test interface board, Thus, if a particular test excitation signal passed by the primary test interface board to a particular electrical connector of the board connector 122a is a power signal, for example, the pass through circuitry of the primary product board 120 routes that power signal to the appropriate power input connector of the socket 124 for the device 112 under test. If the device 112' for example has a power input for that power signal at a different location on its socket 124', the pass through circuitry of the alternate primary product board 120' may be used to route that power signal to the appropriate power input connector of the socket 124' for the device 112' under test. Other test excitation signals and test response signals are routed by the pass through circuitry of the primary product boards 120, 120', to and from the board connectors 122b, 122' so as to be compatible with the pass through circuitry and board connector 122a of the primary test interface board 116. In this manner, the primary product boards 120, 120' are each compatible with the primary test interface board 116 notwithstanding that the device 112 for the product board 120 may be incompatible with the product board 120' for the device 112', and vice versa.

In another aspect of the present description, the test interface 104 may further include one or more auxiliary test interface boards 140, 144 coupled to the primary test interface board 116. Each auxiliary test interface boards 140, 144 carries additional test circuitry for customizing the test interface 104 for testing a particular device 112. For example, as explained in greater detail, the additional test circuitry of the particular auxiliary test interface boards 140, 144 may include logic circuitry for generating test excitation signals suitable for the particular device 112 under test. Other functions may be provided by the auxiliary test interface boards 140, 144 depending upon the particular application. Although FIG. 1 depicts two auxiliary test interface boards 140, 144 coupled at a time to the primary test interface board 116, it is appreciated that in other embodiments, the number of auxiliary test interface boards which may be coupled to the primary test interface board at one time, may vary, depending upon the particular application.

In this example, the primary test interface board 116 is coupled to each auxiliary test interface board 140, 144 by board connectors 148a disposed on the primary test interface board 116, and board connectors 148b disposed on each of the auxiliary test interface boards, 140, 144, as shown in FIG. 1. Signal paths 148c electrically couple each board connector 148a to a corresponding board connector 148b. As a consequence, the auxiliary test interface boards 140, 144 may be readily connected to the primary test interface board 116 by connecting the board connectors 148a and 148b, using the signal paths 148c, to add an auxiliary test interface board 140, 144 to the test system 100 as appropriate for the particular device 112 under test. Similarly, the auxiliary test interface boards 140, 144 may be readily disconnected from the primary test interface board 116 by disconnecting the board connectors 148a and 148b, to remove auxiliary test interface boards 140, 144 from the test system 100 if not needed for the particular device 112, and to thereby substitute different auxiliary test interface boards such as the auxiliary test interface board 140', as appropriate for the particular device 112 to be tested.

In the illustrated embodiment, another function of the primary test interface board 116 may be to pass test excitation signals from the test controller 108 to the particular auxiliary test interface boards, 140, 140', 144 which are connected to the primary test interface board 116. Similarly, another function of the primary test interface board 116 may be to pass test excitation signals from the particular auxiliary test interface boards, 140, 140', 144 which are connected to the primary test interface board 116, to the primary product board 120. Further, another function of the primary test interface board 116 may be to pass test response signals from the primary product board 120 back to the particular auxiliary test interface boards, 140, 140', 144 which are connected to the primary test interface board 116. Still another function of the primary test interface board 116 may be to pass test response signals from the particular auxiliary test interface boards, 140, 140', 144 which are connected to the primary test interface board 116, back to the test controller 108. Still another function of the primary test interface board 116 may be to pass test excitation and test response signals between the various auxiliary test interface boards, 140, 140', 144 which are connected to the primary test interface board 116. Accordingly, the circuitry of the primary test interface board 116 may include pass through circuitry which passes one or more of test excitation and response signals between the board connectors 130b and 148a of the primary test interface board 116, between the board connectors 122a and 148a of the primary test interface board 116, or between the board connectors 148a of the primary test interface board 116.

In the illustrated embodiment, the auxiliary test interface boards 140, 140', 144 each have board connectors 148b, 148b' which are compatible with the board connector 148a of the primary test interface board 116. Accordingly, the mechanical and electrical couplers of the board connectors 148b, 148b' are compatible with the mechanical and electrical couplers of the board connector 148a of the primary test interface board 116. As a result, the auxiliary test interface boards 140, 140', 144 are interchangeably connectable to the primary interface board 116.

Further, the pass through circuitry of the primary test interface board 116 permits the appropriate test excitation and response signals to pass between the board connectors 130b and 148a of the primary test interface board 116, between the board connectors 148a and 122a of the primary test interface board 116, or between the board connectors 148a of the primary test interface board 116, depending upon which auxiliary test interface board 140, 140', 144 is connected to the primary test interface board 116. The test circuitry of each auxiliary test interface board 140, 140', 144 is compatible with the pass through circuitry of the primary test interface board 116. Thus, if a particular test excitation signal passed by the primary test interface board to a particular electrical connector of the board connector 148a is a power signal, for example, the pass through circuitry of the auxiliary test interface board 140, routes that power signal to the appropriate power input of the test circuitry of the auxiliary test interface board 140. If the test circuitry of an alternate auxiliary test interface board 140' has a power input for that power signal at a different location in its test circuitry, the pass through circuitry of the alternate auxiliary test interface board 140' may be used to route that power signal to the appropriate power input of the test circuitry of the alternate auxiliary test interface board 140'. Other test excitation signals and test response signals are routed by the test circuitry of the auxiliary test interface board 140, 140', 144 to and from the board connectors 148b, 148b' so as to be compatible with the pass through circuitry and board connector 148a of the primary test interface board 116. In this manner, the auxiliary test interface board 140, 140', 144 are each compatible with the primary test interface board 116 notwithstanding that the test circuitry of an auxiliary test interface board 140, 144 for the device 112 may be incompatible with the test circuitry of an auxiliary test interface board 140' for the device 112', and vice versa.

In another aspect of the present description, an auxiliary test interface board such as the auxiliary test interface board 144, for example, may be coupled directly to the primary product board 120. Thus, the auxiliary test interface board 144 may have an additional board connector 154a coupled to a board connector 154b disposed on the primary product board 120 as shown in FIG. 1. Signal paths 154c electrically couple each board connector 154a to a corresponding board connector 154b. In some embodiments, the signal paths 154c may be provided a cable between the board connectors 154a and 154b. In other configurations, the board connectors 154a and 154b may physically connected together in an abutting mating relationship.

As a consequence of the direct connection via signal paths 154c, test signals including test excitations signals and test response signals may pass directly between an auxiliary test board such as board 144, and the primary product board, thereby bypassing the circuitry of the primary test interface board 116. Such a direct connection may be appropriate in various testing conditions such as where a more high speed connection may be advantageous for the particular test to be conducted, for example.

In another aspect of the present description, the test interface 104 may further include one or more auxiliary product boards 160 coupled to the primary product board 120. Each auxiliary product board 160 carries additional test circuitry for customizing the interface 104 for testing a particular device 112. For example, as explained in greater detail, the additional test circuitry of the particular auxiliary product board 160 may include logic circuitry for generating test excitation signals suitable for the particular device 112, 112' under test. Other functions may be provided by the auxiliary product boards 160 depending upon the particular application.

In this example, the primary product board 120 is coupled to an auxiliary product board 160 by board connectors 164a disposed on the primary product board 120, and board connectors 164b disposed on the particular auxiliary product board, 160, as shown in FIG. 1. Signal paths 164c electrically couple each board connector 164a to a corresponding board connector 164b. As a consequence, an auxiliary product board 160 may be readily connected to the primary product board 120 by connecting the board connectors 164a and 164b, using the signal paths 164c, to add an auxiliary product board 160 to the test system 100 as appropriate for the particular device 112 under test. Similarly, an auxiliary product board 160 may be readily disconnected from the primary product board 120 by disconnecting the board connectors 164a and 164b, to remove the auxiliary product board 160 from the test system 100 if not needed for the particular device 112,112', and to thereby substitute a different auxiliary product board such as the auxiliary product board 160', as appropriate to the particular device 112, 112' being tested conditions. Although FIG. 1 depicts one auxiliary product board 160 coupled to the primary product board 120, it is appreciated that the primary product board 120 may have fewer or additional auxiliary product boards 160,160' as appropriate for the particular device 112, 112' to be tested.

In the illustrated embodiment, another function of the primary product board 120 may be to pass test excitation signals from the other boards 116, 140, 140', 144, to the particular auxiliary product boards, 160, 160' which are connected to the primary product board 120. Similarly, another function of the primary product board 120 may be to pass test excitation signals from the particular auxiliary product boards, 160, 160' which are connected to the primary product board 120, to the socket 124 and device 112 of the primary product board 120. Further, another function of the primary product board 120 may be to pass test response signals from the particular auxiliary product boards, 160, 160' which are connected to the primary product board 120 back to the other boards 116, 140, 140', 144. Still another function of the primary product board 120 may be to pass test signals including test excitation or test response signals between from the particular auxiliary product boards, 160, 160' which are connected to the primary product board 120. Accordingly, the circuitry of the primary product board 120 may include pass through circuitry which passes test excitation and response signals between the board connectors 122b and 164a of the primary product board 120, between the board connectors 154a and 164a of the primary product board 120, and the socket 124 of the primary product board 120, and the board connects 154b and 164a of the primary product board.

In the illustrated embodiment, the auxiliary product boards 160, 160' each have board connectors 164b, 164b' which are compatible with the board connector 164a of the primary product board 120. Accordingly, the mechanical and electrical couplers of the board connectors 164b, 164b' are compatible with the mechanical and electrical couplers of the board connector 164a of the primary product board 120. As a result, the auxiliary product boards 160, 160' are interchangeably connectable to the primary interface board 120.

Further, the pass through circuitry of the primary product board 120 permits the appropriate test excitation and response signals to pass between the board connectors 122b, 164a and 154b of the primary product board 120, depending upon which auxiliary product board 160, 160' is connected to the primary product board 120. The test circuitry of each auxiliary product board 160, 160' is compatible with the pass through circuitry of the primary product board 120, Thus, if a particular test excitation signal passed by the primary product board to a particular electrical connector of the board connector 164a is a power signal, for example, the pass through circuitry of the auxiliary product board 160, routes that power signal to the appropriate power input of the test circuitry of the auxiliary product board 160. If the test circuitry of an alternate auxiliary product board 160' has a power input for that power signal at a different location in its test circuitry, the pass through circuitry of the alternate auxiliary product board 160' may be used to route that power signal to the appropriate power input of the test circuitry of the alternate auxiliary product board 160'. Other test excitation signals and test response signals are routed by the test circuitry of the auxiliary product board 160, 160' to and from the board connectors 164b, 164b' so as to be compatible with the pass through circuitry and board connector 164a of the primary product board 120. In this manner, the auxiliary product boards 160, 160' are each compatible with the primary product board 120 notwithstanding that the test circuitry of an auxiliary product board 160 for the device 112 may be incompatible with the test circuitry of an auxiliary product board 160' for the device 112', and vice versa.

Figure 2:
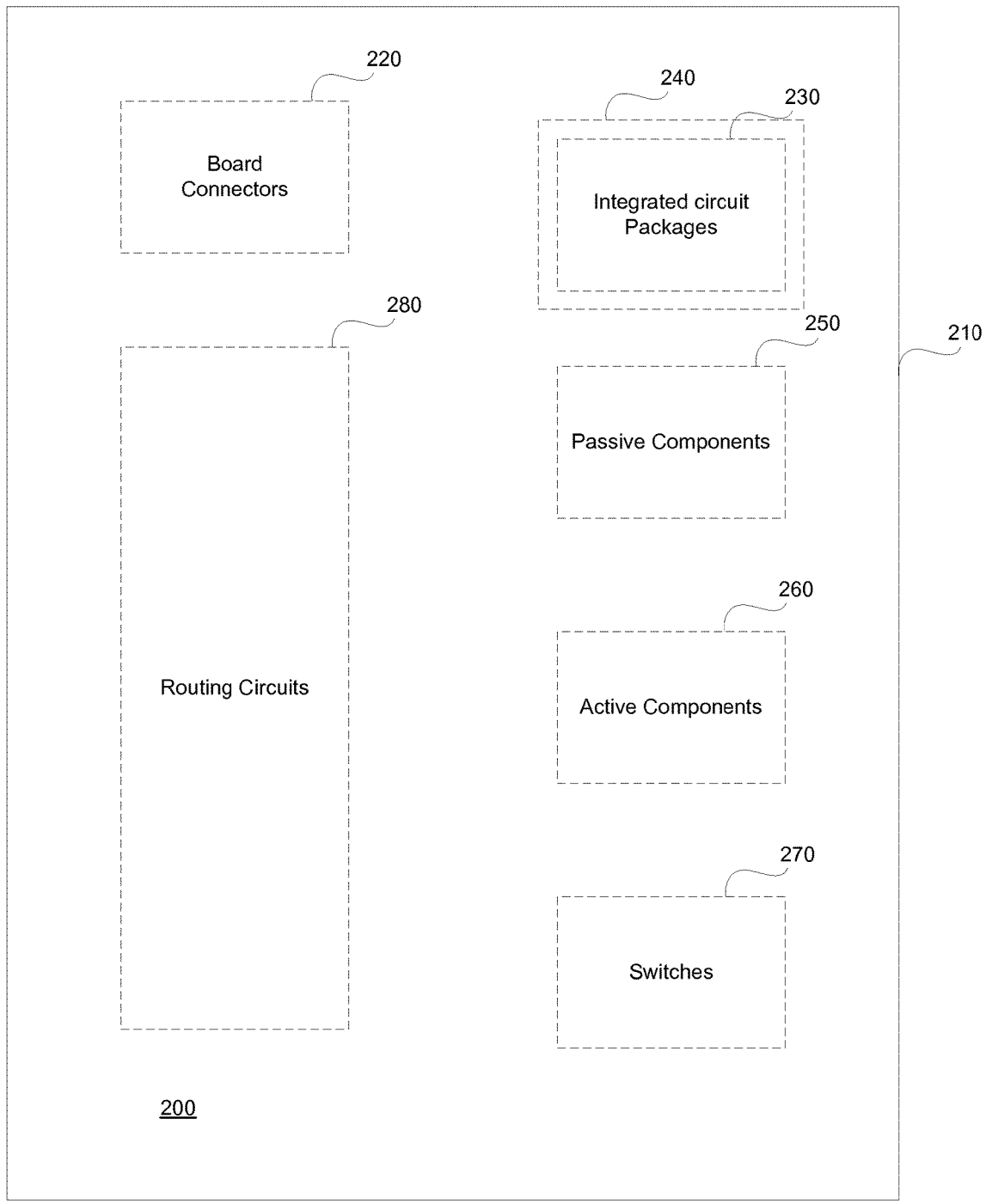
FIG. 2 is a schematic diagram of one embodiment of a board of the test interface of FIG. 1.

FIG. 2 shows an embodiment of a board 200 which is of a type suitable for use as one or more of the boards 116, 120, 120', 140, 140', 144, 160, or 160' of the test interface 104 of FIG. 1. In this embodiment, the board 200 is a printed circuit board having a substrate 210 made of a suitable material such as fiberglass, ceramic, glass or other materials which can provide mechanical support for components disposed on the board 200. The substrate 210 may be relatively stiff or flexible and is typically made of an electrically insulative material although in some embodiments, an electrically conductive material may be utilized as well. The substrate 210 may have a single layer or may be formed of multiple layers including electrically insulative and conductive layers.

The board 200 as representative of one or more of the boards 116, 120, 120', 140, 140', 144, 160, or 160' of the test interface 104 of FIG. 1, may optionally have one or more components disposed on or embedded within the substrate 210 to perform the functions of the particular board. These optional components include board connectors 220, integrated circuit packages 230, integrated circuit sockets 240, passive components 250, active components 260, switches 270, routing circuits 280 and other electrical or mechanical devices suitable for performing one or more test interface functions.

In accordance with the present description, components which are suitable for testing a relatively large number of types of devices may suitable for placing on the primary test interface board 116. Conversely, components which are suitable for testing a more narrow range of devices or perhaps a single type of device may be more suitable to be placed upon an auxiliary test interface board 140, 140', 144 or a an auxiliary product board 160, 160' or primary product board 120, 120'. Thus, the boards 116, 120, 120', 140, 140', 144, 160, or 160' of the test interface 104 of FIG. 1 may selectively have some but not all of the components such as the board connectors 220, integrated circuit packages 230, integrated circuit sockets 240, passive components 250, active components 260, switches 270, or routing circuits 280, depending upon the particular application.

In the illustrated embodiment, each of the boards 116, 120, 120', 140, 140', 144, 160, and 160' of the test interface 104 of FIG. 1, has routing circuitry 280 and board connectors 210 as described above for coupling one board to another board. The routing circuitry 280 may include suitable conductive paths printed on or embedded in the substrate 210 of the particular board. The board connectors 130a, 130b, 122a, 122b, 122b', 148a, 148b, 148b', 154a, 154b, 154b', 164a, 164b, 164b' represented by the board connectors 210 may be any suitable connector for mechanically or electrically coupling one board to another. Suitable board connectors include orthogonal connectors, edge connectors, cable connectors and mezzanine connectors. Other board connectors may be used, depending upon the particular application.

As described above, the primary product board 120 and alternate primary product board 120' have an integrated circuit device under test received in a socket as represented by the integrated circuit package 230 and receptacle 240 of FIG. 2. Other boards such as the auxiliary test interface boards 140, 140', 144 and the auxiliary product boards 160, 160' may also have one or more integrated circuit packages as represented by the integrated circuit package 230 of FIG. 2, used to test a device on the primary product board. For example, logic circuitry for generating, storing or analyzing test signals may be implemented with suitable integrated circuit packages mounted on one or more of the auxiliary test interface boards 140, 140', 144 and the auxiliary product boards 160, 160'. Other functions which may be implemented by integrated circuit packages disposed on selected boards of the test interface include signal amplifiers, repeaters, directional couplers, dual mode (such as pass-through and high frequency) circuitry, etc. It is appreciated that the primary test interface board 116 and the primary product board 120, 120' may also have integrated circuit devices for logic circuitry or other functions, depending upon the particular application.

Other optional components include the passive components 250 such as capacitors and inductors, active components 260 such as transistors, diodes, emitters, receptors etc. and switches 270 including analog and digital, mechanical and electronic. Here too, components 250, 260, 270 which are suitable for testing a relatively large number of types of devices may be suitable for placing on the primary test interface board 116. Conversely, components which are suitable for testing a more narrow range of devices or perhaps a single type of device may be more suitable to be placed upon an auxiliary test interface board 140, 140', 144 or a an auxiliary product board 160, 160' or primary product board 120, 120'.

Figure 3:
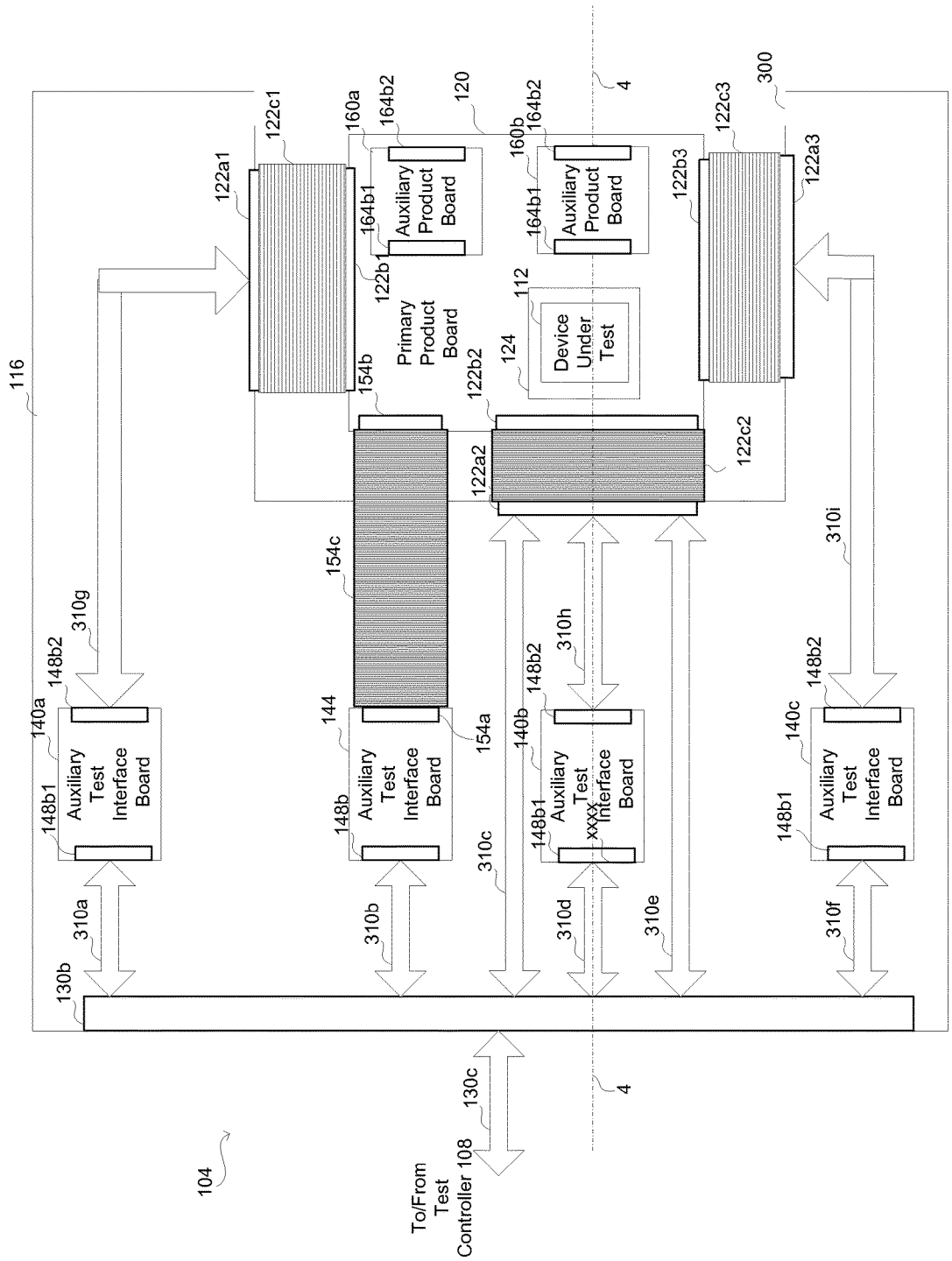
FIG. 3 is a top view of one embodiment of a test interface for testing integrated circuit devices in accordance with the present description.
Figure 4:
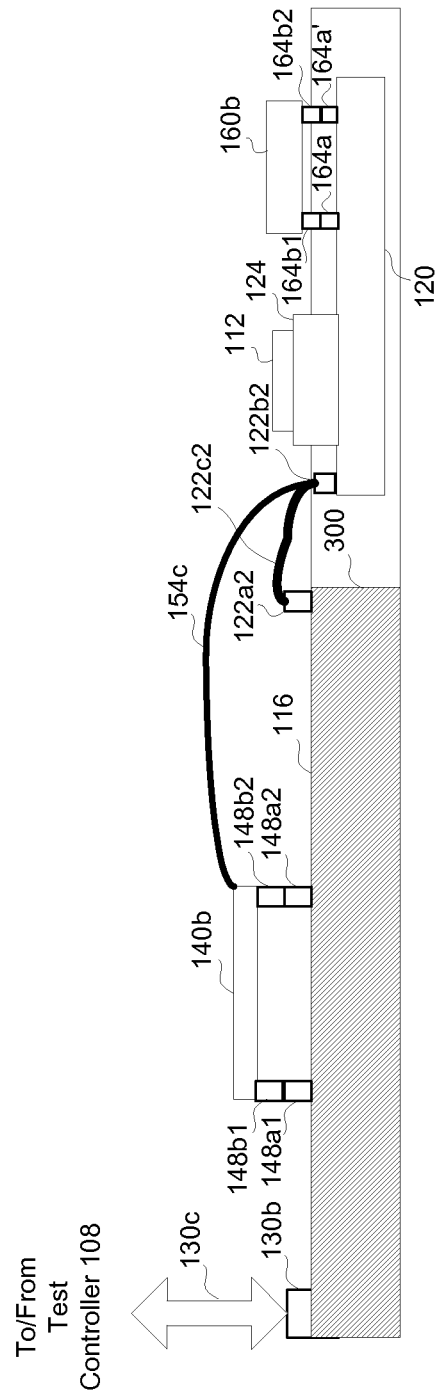
FIG. 4 is a partial cross-sectional view of the test interface of FIG. 3, as viewed along the lines 4-4 of FIG. 3.

FIGS. 3 and 4 illustrate a more detailed example of a test interface 104 between a test controller 108 (FIG. 1) of the testing system 100, and an integrated circuit device 112 under test. In accordance with another aspect of the present description, the primary test interface board 116 defines an opening 300 which is sized sufficiently to receive a primary product board such as the primary product board 120, for example. In the illustrated embodiment, the opening 300 and the primary product board 120 are each generally rectangular in shape. However, it is appreciated that other shapes may be utilized, depending upon the particular application. Also, in the illustrated embodiment, the primary test interface board 116 and the primary product board 120 are each substantially coplanar with each other as best seen in FIG. 4. However, it is appreciated that arrangements such as orthogonal, askew, and displaced parallel may be utilized, depending upon the particular application.

In the embodiment of FIGS. 3 and 4, the test interface 104 has two auxiliary product boards 160*a*, 160*b*. In this example, the auxiliary product boards 160*a*, 160*b* are disposed generally parallel to and spaced from the plane of the underlying primary product board 120, as best seen for the auxiliary product board 160*b* of FIG. 4. The auxiliary product boards 160*a*, 160*b* may be mechanically secured to the primary product board 120 using suitable fasteners and spacers. The auxiliary product boards 160*a*, 160*b* as well as the integrated circuit device 112 and socket 124 may be coupled to either the top side (as shown) or the bottom side of the primary product board 120. The auxiliary product boards 160*a*, 160*b* may be electrically coupled to routing circuitry of the primary product board 120 using suitable connectors such as the board connectors 164*b*1 and 164*b*2 of each auxiliary product boards 160*a*, 160*b*, and compatible board connectors 164*a* and 164*a'* (FIG. 4) of the primary test interface board 116. Suitable board connectors include mezzanine type board connectors although it is appreciated that other types of connectors may be used such as edge type board connectors, for example.

Although the auxiliary product boards 160*a*, 160*b* are depicted as being connected in a parallel manner to the primary product board 120, it is appreciated that the auxiliary product boards 160*a*, 160*b* may be coupled to the primary product board in a nonparallel, such as orthogonal, manner, for example. Also, in some embodiments, the auxiliary product boards 160*a*, 160*b* may not be mechanically connected directly to the primary interface board but may be spaced from and electrically connected to the primary product board 120 by suitable cables for example.

In the embodiment of FIGS. 3 and 4, the test interface 104 has four auxiliary test interface boards 140*a*-140*c* and 144. In this example, the auxiliary test interface boards 140*a*-140*c* and 144 are disposed generally parallel to and spaced from the plane of the underlying primary test interface board 116, as best seen for the auxiliary test interface board 140*b* of FIG. 4. The auxiliary test interface boards 140*a*-140*c* and 144 may be mechanically secured to the primary test interface board 116 using suitable fasteners and spacers. The auxiliary test interface boards 140*a*-140*c* and 144 may be coupled to either the top side (as shown) or the bottom side of the primary test interface board 116. The auxiliary test interface boards 140*a*-140*c* and 144 may be electrically coupled to routing circuitry of the primary test interface board 116 using suitable connectors such as the board connectors 148*b*1 and 148*b*2 of each auxiliary test interface boards 140*a*-140*c* and 144, and compatible board connectors 148*a*1 and 148*a*2 (FIG. 4) of the primary test interface board 116. Suitable board connectors include mezzanine type board connectors although it is appreciated that other types of connectors may be used such as edge type board connectors, for example.

Although the auxiliary test interface boards 140*a*-140*c* and 144 are depicted as being connected in a parallel manner to the primary test interface board 116, it is appreciated that the auxiliary test interface boards 140*a*-140*c* and 144 may be coupled to the primary interface board in a nonparallel, such as orthogonal, manner, for example. Also, in some embodiments, the auxiliary test interface boards 140*a*-140*c* and 144 may not be mechanically connected directly to the primary interface board but may be spaced from and electrically connected to the primary interface board 116 by suitable cables for example.

In the illustrated embodiment, the primary interface board 116 has a plurality of board connectors 130*b* for electrically and mechanically coupling to the test controller 108 (FIG. 1), and a plurality of board connectors 122*a*1-122*a*3 for electrically coupling to the primary product board 120. The primary interface board 116 has routing circuitry which includes routing circuits 310*a*-310*i* for interconnecting the various board connectors 130*b*, 148*a*1, 148*a*2 (FIG. 4) and 122*a*1-122*a*3 of the primary interface board 116 as shown in FIGS. 3 and 4. Thus, for example, board connector 130 is coupled by routing circuit 310*d* to board connector 148*a*1 (FIG. 4), which is coupled to board connector 148*b*1 (FIG. 3) of auxiliary test interface board 140*b* having board connector 148b2 coupled to board connector 148a2 (FIG. 4) coupled by routing circuit 310h (FIG. 3) to board connector 122a2 of the primary test interface board 116.

Also in the illustrated embodiment, the primary product board 120 is coupled to the primary test interface board 116 by a plurality of flex connectors 122c1, 122c2, 122c3 which extend from the board connectors 122a1, 122a2, 122a3 of the primary test interface board 116 to the board connectors 122b1, 122b2, 122b3, respectively of the primary product board 120, as shown in FIG. 3. Further, in the illustrated embodiment, the auxiliary test interface board 144 disposed on the primary test interface board 116, is coupled to the primary product board 120 by a flex connector 154c which extends from the board connector 154a of the auxiliary test interface board 144 directly to the board connector 154b of the primary product board 120. Such an arrangement permits the routing circuitry of the primary test interface board 116 to be bypassed by the flex cable 154c. Bypassing the routing circuits of the primary test interface 116 may provide, for example, a faster circuit path between an auxiliary test interface board such as the board 144, and the circuits of the primary product board.

It is appreciated that in other embodiments, other types of cables and other electrical connectors may be used instead of the flex connectors 122c1, 122c2, 122c3, 154c. Also, in other embodiments, the board connectors 122a1, 122a2, 122a3 of the primary test interface board 116 and the board connector 154a of the auxiliary test interface board 144 may be electrically and mechanically coupled directly in physical engagement to the board connectors 122b1, 122b2, 122b3, 154b, respectively of the primary product board 120.

Figure 5:
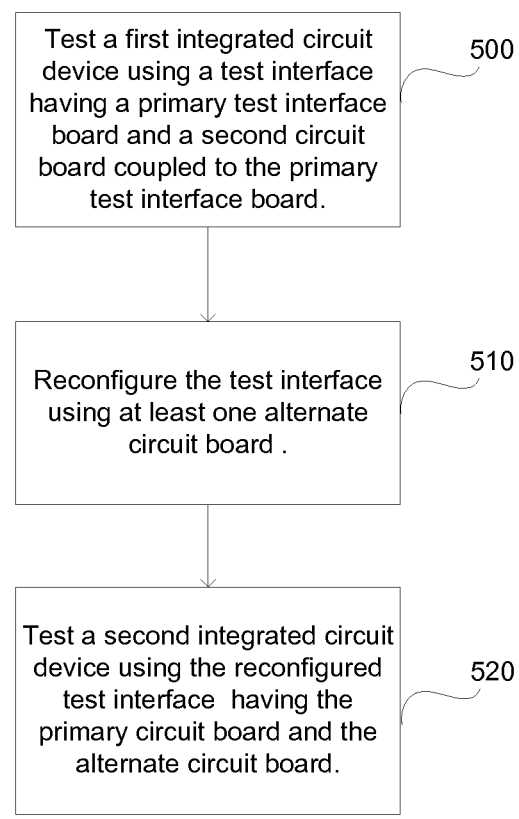
FIG. 5 illustrates an example of testing operations in accordance with one embodiment of the present description.

FIG. 5 depicts one example of operations for testing an integrated circuit in accordance with one aspect of the present description. In one operation, a first integrated circuit device is tested (block 500) using a test interface such as the test interface 104, having a primary test interface board such as the primary test interface board 116, and a second circuit board coupled to the primary test interface board during testing of an integrated circuit device. For example, a primary product board 120 may be coupled to the primary test interface board 116. In another example, an auxiliary board such as an auxiliary test interface board 140 may be coupled to the primary test interface board during testing of an integrated circuit device such as the device 112.

In another operation, the test interface may be reconfigured (block 510) by using at least one alternate circuit board. In one example, an alternate auxiliary test interface board 140' may be substituted for the auxiliary test interface board 140. In another example, an auxiliary test interface board may be added to or removed from the test interface 104. In another example, an auxiliary product board may be added to or removed from the test interface 104. A second integrated circuit device may be tested (block 520) using the reconfigured test interface having the primary circuit board and the alternate circuit board.

Figure 6:
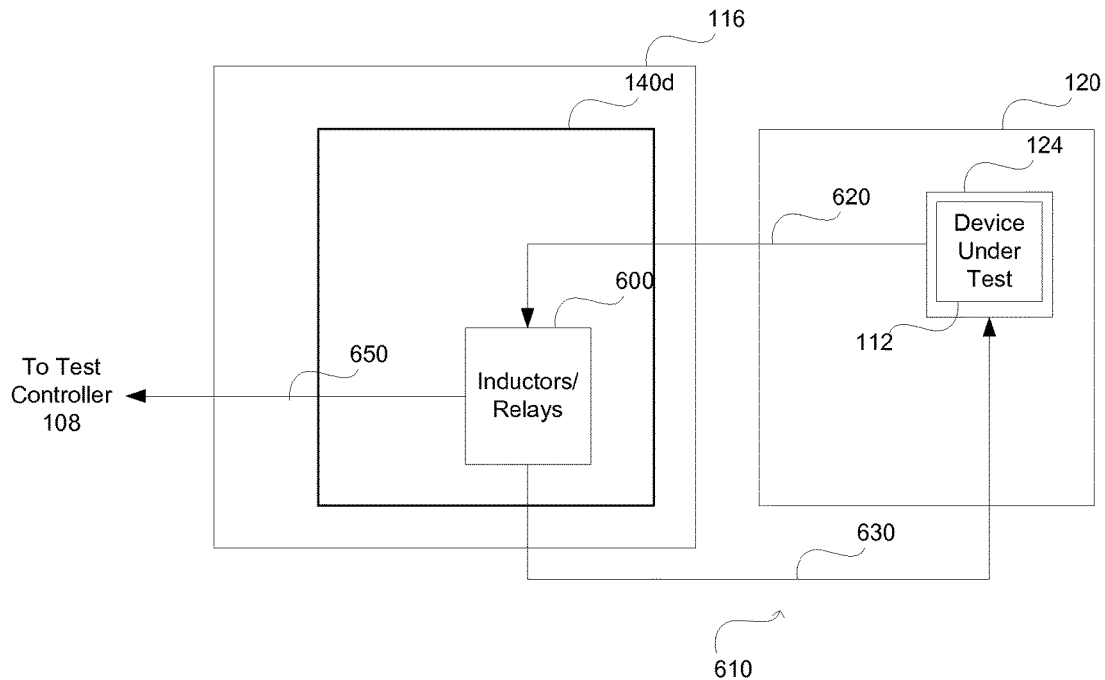
FIG. 6 is a schematic diagram of another embodiment of a test interface for testing integrated circuit devices in accordance with the present description.

FIG. 6 depicts an example of a reusable auxiliary test interface board 140d which has test circuitry for testing the device 112 on the primary product board 120. In this example, the test circuitry of the board 140d includes a plurality of inductor or relay circuits 600 for a high speed loopback circuit 610 for testing the device 112 on the primary product board 120. For those types of devices 112 which may utilize the test circuitry of the auxiliary test interface board 140a, the board 140d may be readily connected to the primary test interface board 116 of the test interface 104, by connecting together the appropriate board connectors as described above in connection with the auxiliary test interface boards. Conversely, for those types of devices 112 which do not utilize the test circuitry of the auxiliary test interface board 140d, the board 140d may be readily removed from the primary test interface board 116 of the test interface 104, by disconnecting the board connectors as described above.

In some embodiments, an auxiliary test interface board such as the auxiliary test interface board 140d, for example, may be used to test a wide range of different types of devices 112. Hence, an auxiliary board such as the auxiliary test interface board 140d may be selectively used and reused as appropriate depending upon the particular type of device 112 to be tested. Accordingly, the test circuitry of the particular auxiliary test interface board such as the board 140d may be selectively added to or removed from the test interface 104 by the expedient of adding or removing the particular auxiliary interface board independently of the test circuitry of other boards such as the primary test interface board and the primary product board 120 or the other auxiliary boards. As a consequence, test circuitry such as the loopback circuit 610 need not be placed on a more product specific board which may be more likely to be disposed of when that particular product need no longer be tested.

In the illustrated embodiment, the loopback circuit 610 includes a transmitter path 620 such as a PCIe Tx path for example, and a receiver path 630 such as a PCIe Rx path, which couple the device 112 under test with the relay or inductor circuits 600, to form the loopback circuit 610. The transmitter path 620 and receiver path 630 may include conductive paths of the routing circuitries on board the primary test interface board 116 and the primary product board 120. Alternatively, the transmitter path 620 and receiver path 630 may include conductive paths of a direct connection cable, for example, thereby bypassing one or more of the routing circuitries of the primary test interface board 116 and the primary product board 120. Test signals including test activation signals and test results signals may be sent or received in a path 650 to the test controller 108. The path 650 may include conductive paths of the routing circuitries on board the primary test interface board 116 and the auxiliary test interface board 140d.

Figure 7:
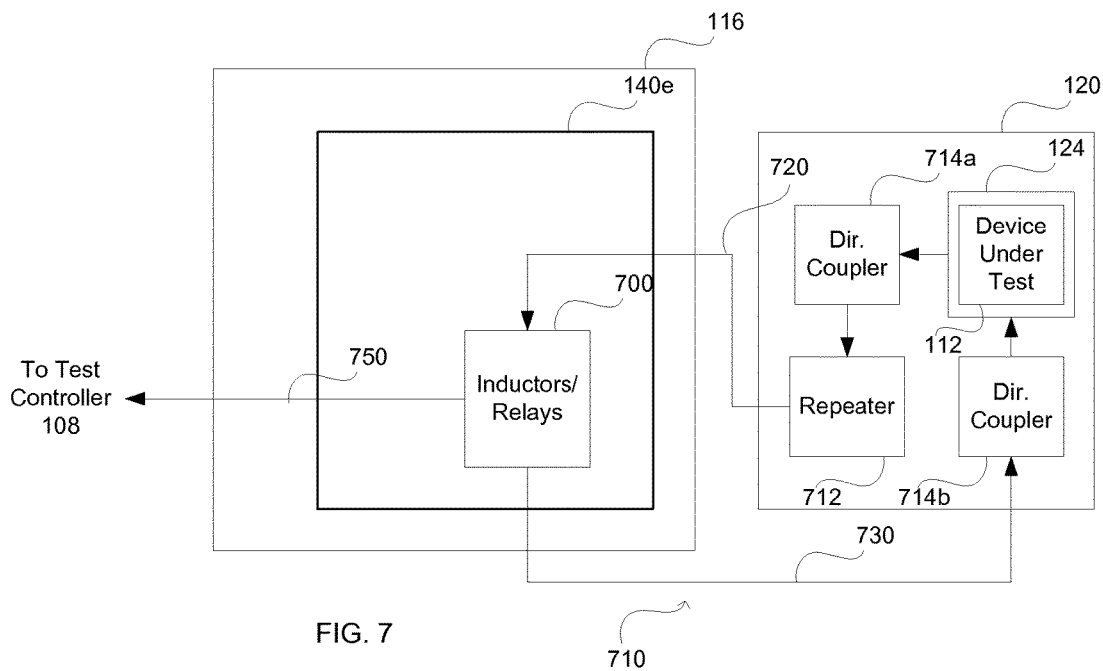
FIG. 7 is a schematic diagram of yet another embodiment of a test interface for testing

As noted above, a high speed loopback circuit such as the circuit 610 may be suitable for testing a wide range of products 112 disposed on the particular primary product board 120 which is appropriate for that particular device 112. However, other types of devices 112 may be disposed on a primary product board 120 which may benefit from additional signal conditioning. Accordingly, FIG. 7 also shows another example of test circuitry on a reusable auxiliary test interface board 140e which has a plurality of inductor or relay circuits 700 to provide a high speed loopback circuit 710 for testing the device 112 on the primary product board 120. However, in the embodiment of FIG. 7, the loopback circuit 710 further has a repeater circuit 712 to boost test signals output by the device 112 under test, to the inductors or relays 700. The repeater circuit 712 may be analog or digital, depending upon the type of test signals output by the device 112. Further, directional couplers such as the couplers 714a, 714b may be added to the transmitter path 720 and the receiver path 730, respectively, to facilitate calibration of input amplitude versus output amplitude, for example. Test signals including test activation signals and test results signals may be sent or received in a path 750 to the test controller 108. The path 750 may include conductive paths of the routing circuitries on board the primary test interface board 116 and the auxiliary test interface board 140e.

The loopback circuits 610, 710 and other test circuitry of the auxiliary test interface boards may include other circuits, depending upon the particular application.

In the illustrated embodiments, the loopback circuits 610, 710 have been placed upon auxiliary test interface boards 140d, 140e, respectively. It is appreciated that test circuitry such as the loopback circuits 610, 710 may be placed upon other auxiliary boards, such as the auxiliary product boards 160, 160', or the primary boards such as the primary test interface board 116 or the primary product board 120, 120', depending upon the particular application.

Figure 8:
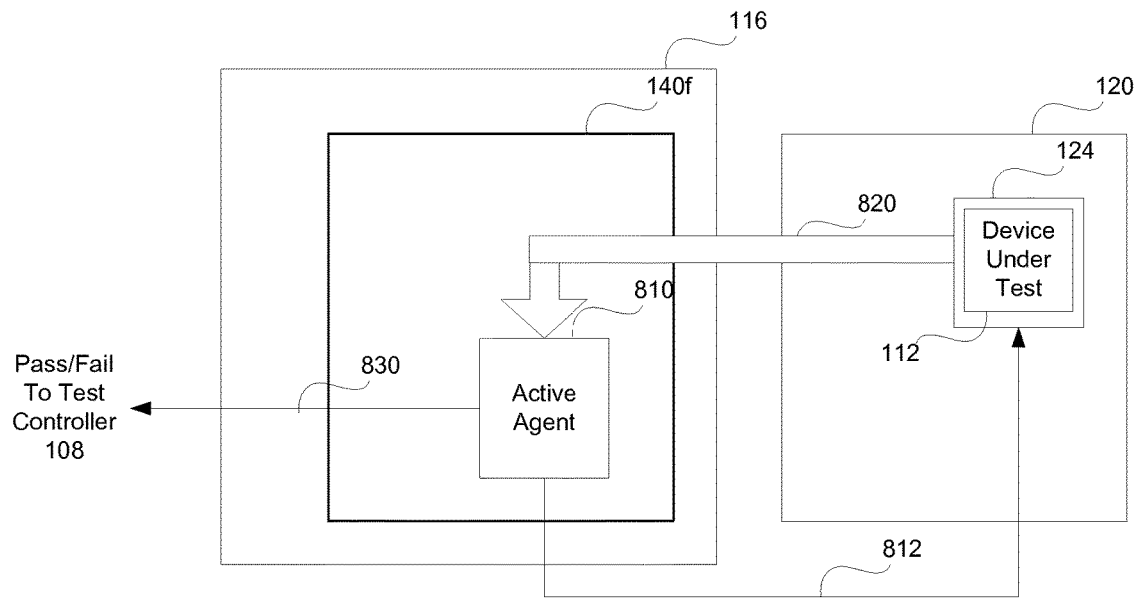
FIG. 8 is a schematic diagram of still another embodiment of a test interface for testing integrated circuit devices in accordance with the present description.

FIG. 8 shows another example of test circuitry 800 which may be placed upon an auxiliary board such as an auxiliary test interface board 140f. In this embodiment, the test circuitry 800 includes an active agent such as integrated circuit 810 that can functionally test an interface such as a unidirectional display port of the device 112 under test at signal speeds which are commensurate with those of the device 112 in normal use. The integrated circuit 810 can generate appropriate test excitation signals in response to the test controller 108 and transmit them over a bus 812 to the device 112. In response, the device 112 generates test response signals in the form of interface traffic on a display port path 820. The integrated circuit 810 can decode that interface traffic and make a determination as to whether the device 112 passes or fails that particular test. The test results may be output to the test controller 108 over conductive paths 830.

In one example, the integrated circuit may perform tests using logic circuitry such as cyclic redundancy check (CRC) tests or other logic testing for particular signal signatures. Here too, it is appreciated that other types of test circuitry employing other types of integrated circuits may be placed upon an auxiliary board such as the board 140f. As a consequence, test circuitry such as the integrated circuit test circuitry 800 need not be placed on a more product specific board which may be more likely to be disposed of when that particular product need no longer be tested.

In some embodiments, a test circuit disposed on a board of the test interface, such as an auxiliary test interface board, for example, may have complex logic circuitry on board for generating test excitation signals which may be in response to a test excitation signal from the test controller. The test excitations signals generated on board an individual board of the test interface may include complex bit patterns and complex timing sequences of multiple excitation signals which are routed to the device under test on the primary product. A test excitation signal generated by the board may include a data signal, an address signal, a control signal, a power signal, a ground signal, etc. The logic circuitry on board the individual board of the test interface may also receive test response signals from the device under test and store and analyze the test response signals. For example, the logic circuitry on board the test board may analyze the test response signals from the device under test and provide a pass/fail test response signal to the test controller.

Figure 9:
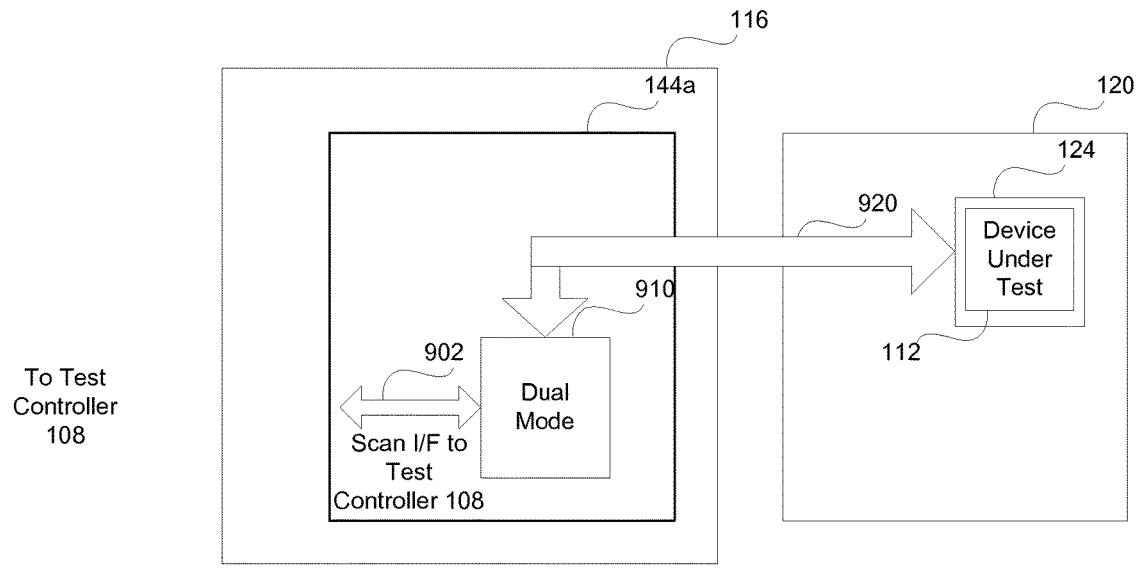
FIG. 9 is a schematic diagram of still another embodiment of a test interface for testing integrated circuit devices in accordance with the present description.

Another example of test circuitry which may be placed upon an auxiliary board such as the auxiliary test interface board 144a is indicated at 900 in FIG. 9. The test circuitry 900 of this embodiment is a dual mode circuit which can provide "at-speed" functional testing of a device under test, but also an interface which, in this example, may also serve as a low-speed test scan port. In testing many products which operate at high frequency, the electronics of a test controller are frequently insufficiently fast to provide test signals at the maximum frequency of operation of the device under test. Instead, in many test systems, the test controller often provides a scan interface 902 for low-speed test signals to test various aspects such as the structure of the device.

In the illustrated embodiment, an integrated circuit 910 of the test circuit 900 may be programmed to operate in one of two modes. In a first mode, in response to a test control signal from the test controller 108, the integrated circuit 910 can function as a pass-through buffer, forwarding test signal traffic along a bus 920 from the test controller 108 to the device 112 under test, and from the device 112 back to the test controller 108. However, when it is appropriate to test the device 112 at speed, that is at significantly higher rates at which the device 112 normally operates, the circuit 910 may be switched by the test controller 108 to a port emulator mode of operation where the circuit 910 operates as if it were a high speed circuit, such as emulating a DDR3 memory module, to test the device 112. It is appreciated that a multi-mode circuit such as the test circuit 900 may be programmed to emulate various devices, depending upon the particular application.

Figure 10:
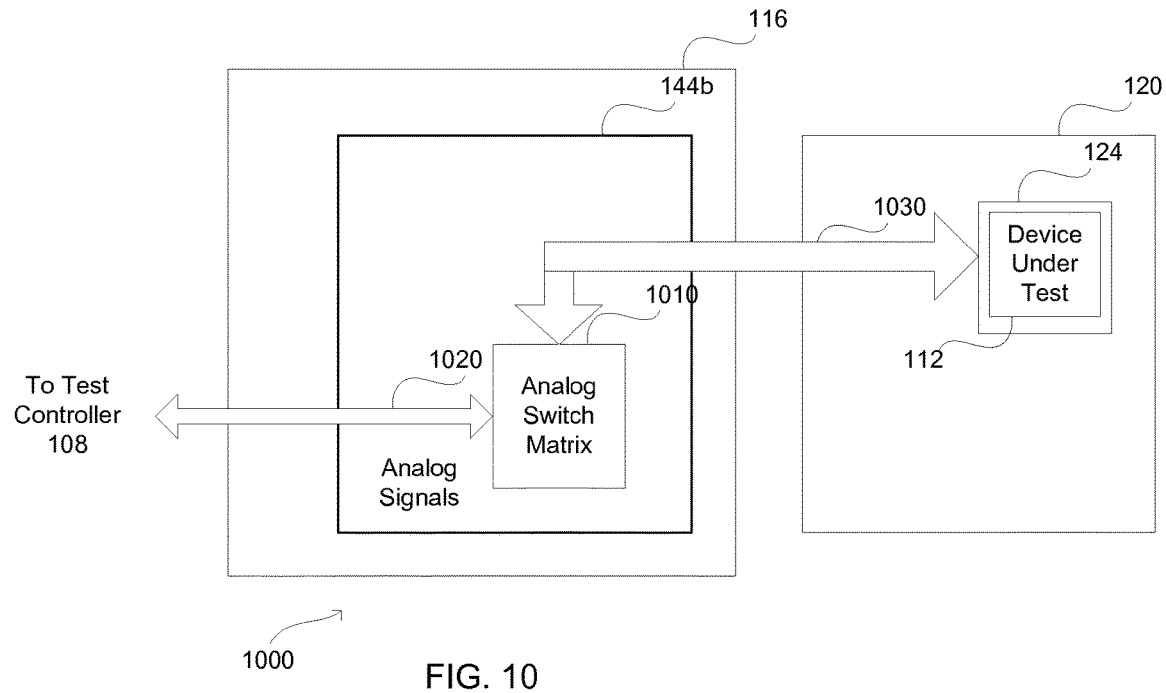
FIG. 10 is a schematic diagram of still another embodiment of a test interface for testing integrated circuit devices in accordance with the present description.

FIG. 10 illustrates another example of a test circuit 1000 which may be placed upon an auxiliary board such as the auxiliary test interface board 144b. The test circuitry 1000 of this embodiment includes an analog switch matrix 1010 which provides the capability for switching a relatively small number of channels 1020, such as 25 channels, for example, to a relatively larger number of channels 1030, for a larger number of contacts, such 320, for example, of the device 112. Such a switch matrix may be used in a variety of tests such as DC parametric tests of analog signals, for example.

Although the embodiments of FIGS. 6-10 have described various test circuits disposed on an auxiliary test interface card. It is appreciated that the test circuits described herein may be disposed on other boards such as the auxiliary product boards, the primary product boards or the primary test interface board, for example. In addition, the test circuits described herein are provided as examples. It is appreciated that the type of test circuits which may be disposed on primary and auxiliary boards of a test interface in accordance with the present description, may vary, depending upon the particular application.

Certain embodiments of the present description have been described in connection with testing integrated circuit products or other devices which are connected to a printed circuit board. It is appreciated that a test interface in accordance with the present description may be utilized in other applications such as, for example, wafer sort testing typically involving the use of probing technology wherein mechanical probes extending from a probe card engage electrical contact features of an integrated circuit on a die, and connect the contact features to a tester of a testing apparatus. During such testing, a handler is frequently used to support the wafer or die on a platform or chuck and positions the die so as to precisely align the die bumps, bond pads or other electrical contact features of a die to be tested with the probe features on the probe card. It is appreciated that a test interface in accordance with the present description may include a primary test interface board, a product probe board coupled to the primary test interface board, optional auxiliary boards, and wafer or die handler.

EXAMPLES

The following examples pertain to further embodiments.

Example 1 is a method, comprising: testing a first integrated circuit device using a test controller and a test interface coupled to the test controller, the first device testing comprising: using the test controller, generating test signals; using a primary test interface board of the test interface, forwarding test signals from the test controller to a first removable primary product board of the test interface connected to the primary test interface board, the first primary product board having the first integrated circuit device under test disposed on the first primary product board, and forwarding test response signals from the first primary product board back to the test controller; and reconfiguring the test interface to test a second, different integrated circuit device.

In Example 2, the subject matter of Example 1, can optionally include wherein the reconfiguring comprises substituting an alternate removable primary product board for the first primary product board, said substituting comprising: removing the first primary product board from the primary test interface board and connecting a removable alternate primary product board to the primary test interface board instead of the first primary product board; and wherein the method further comprises testing the second integrated circuit device using the test controller and the reconfigured test interface coupled to the test controller, the second device testing comprising: using the primary test interface board, forwarding test signals from the test controller to the alternate primary product board removably connected to the primary test interface board, the alternate primary product board having the second integrated circuit device under test disposed on the alternate primary product board, and forwarding test response signals from the alternate primary product board back to the test controller.

In Example 3, the subject matter of Example 1 can optionally include wherein the first device testing comprises: forwarding test signals from test circuitry of a first removable auxiliary test interface board connected to the primary test interface board, to the first primary product board, for testing the first integrated circuit device under test disposed on the first primary product board.

In Example 4, the subject matter of Example 2, can optionally include wherein the reconfiguring further comprises substituting an alternate removable auxiliary test interface board for the first auxiliary test interface board, said substituting comprising: removing the first auxiliary test interface board from the primary test interface board and connecting the alternate removable auxiliary test interface board to the primary test interface board instead of the first auxiliary test interface board; and wherein the method further comprises forwarding test signals from test circuitry of the alternate auxiliary test interface board connected to the primary test interface board, to the alternate primary product board, for testing the second integrated circuit device under test disposed on the alternate primary product board.

In Example 5, the subject matter of Example 3 can optionally include wherein said forwarding from the first removable auxiliary test interface board comprises using a cable connected between the first removable auxiliary test interface board and the first primary product board to forward the test signals from test circuitry of the first removable auxiliary test interface board connected to the primary test interface board, to the first primary product board.

In Example 6, the subject matter of Example 1 can optionally include wherein the first device testing further comprises: using the first primary product board, forwarding test signals from test circuitry of a first removable auxiliary product board connected to the primary product board, for testing an integrated circuit device under test disposed on the first primary product board.

In Example 7, the subject matter of Example 6 can optionally include wherein the reconfiguring comprises substituting an alternate removable auxiliary product board for the first auxiliary product board, said substituting comprising: removing the first auxiliary product board from the primary product board and connecting the alternate removable auxiliary product board to the primary product board instead of the first auxiliary product board.

Example 8 is a system for testing an integrated circuit device, comprising: a test controller for generating and receiving test signals; and a test interface adapted to be coupled between the test controller and the integrated circuit device, the test interface comprising: a primary test interface board for forwarding test signals from the test controller, and receiving test response signals and forwarding received test response signals to the test controller; and a first removable primary product board selectively and removably coupled to the primary test interface board, for supporting the integrated circuit device, and for forwarding test signals from the primary test interface board to the integrated circuit device and for receiving test response signals from the integrated circuit device and forwarding received test response signals to the primary test interface board.

In Example 9, the subject matter of Example 8 can optionally include wherein the first primary product board and the primary test interface board each have board connectors wherein the first primary product board is selectively connected to and disconnected from the primary test interface board, the test interface further comprising an alternate removable primary product board for selectively coupling to the primary interface board instead of the first primary product board, the alternate removable primary product board for supporting a second integrated circuit device, and for forwarding test signals from the primary test interface board to the second integrated circuit device and for receiving test response signals from the second integrated circuit device and forwarding received test response signals to the primary test interface board when the alternate primary product board is selectively coupled to the primary interface board instead of the first primary product board.

In Example 10, the subject matter of Example 8 can optionally include wherein the test interface further comprises a first removable auxiliary test interface board which is selectively and removably coupled to the primary test interface board, the first auxiliary test interface board having test circuitry for testing the integrated circuit device disposed on the first primary product board.

In Example 11, the subject matter of Example 10 can optionally include wherein the first auxiliary test interface board and the primary test interface board each have board connectors wherein the first auxiliary test interface board is selectively connected to and disconnected from the primary test interface board, the test interface further comprising an alternate removable auxiliary test interface board for selectively and removably coupling to the primary interface board instead of the first primary test interface board, the alternate removable auxiliary test interface board having test circuitry for testing the integrated circuit device disposed on the first primary product board when the alternate auxiliary test interface board is selectively coupled to the primary interface board instead of the first auxiliary test interface board.

In Example 12, the subject matter of Example 10 can optionally include wherein the primary test interface board has routing circuitry for forwarding test signals from the test circuitry of the first auxiliary test interface board to the first primary product board.

In Example 13, the subject matter of Example 10 can optionally include wherein the test interface further comprising a cable coupled between the first auxiliary test interface board and the first primary product board, for forwarding test signals from the test circuitry of first removable auxiliary test interface board to the first primary product board.

In Example 14, the subject matter of Example 8 can optionally include wherein the test interface further comprises a first removable auxiliary product board which is selectively and removably coupled to the first primary product board, the first auxiliary product board having test circuitry for testing the integrated circuit device disposed on the first primary product board, wherein the first auxiliary product board and the first primary product board each have board connectors wherein the first auxiliary product board is selectively connected to and disconnected from the first primary product board, the test interface further comprising an alternate removable auxiliary product board for selectively and removably coupling to the first primary product board instead of the first auxiliary product board, the alternate removable auxiliary product board having test circuitry for testing the integrated circuit device disposed on the first primary product board when the alternate auxiliary product board is selectively coupled to the first primary product board instead of the first auxiliary product board.

In Example 15, the subject matter of Example 8 can optionally include wherein the primary test interface board is a first printed circuit board, and the primary product board is a second printed circuit board having an integrated circuit socket disposed on the second printed circuit board, and is adapted to receive and electrically couple to an integrated circuit device to be tested.

In Example 16, the subject matter of Example 15 can optionally include wherein the first printed circuit board of the primary interface board defines an opening and the second printed circuit board of the primary product board is received in and substantially coplanar with the opening of the first printed circuit board.

In Example 17, the subject matter of Example 10 can optionally include wherein the test circuit of the first auxiliary test interface board comprises at least one of a relay loopback circuit, a relay and repeater loopback circuit, logic circuitry, dual mode test circuitry, and analog switch matrix circuitry.

Example 18 is a test interface device for use with a test controller for generating and receiving test signals for testing an integrated circuit device, comprising: a primary test interface board for forwarding test signals from the test controller, and receiving test response signals and forwarding received test response signals to the test controller; and a first removable primary product board selectively and removably coupled to the primary test interface board, for supporting the integrated circuit device, and for forwarding test signals from the primary test interface board to the integrated circuit device and for receiving test response signals from the integrated circuit device and forwarding received test response signals to the primary test interface board.

In Example 19, the subject matter of Example 18 can optionally include wherein the first primary product board and the primary test interface board each have board connectors wherein the first primary product board is selectively connected to and disconnected from the primary test interface board, the test interface device further comprising an alternate removable primary product board for selectively coupling to the primary interface board instead of the first primary product board, the alternate removable primary product board for supporting a second integrated circuit device, and for forwarding test signals from the primary test interface board to the second integrated circuit device and for receiving test response signals from the second integrated circuit device and forwarding received test response signals to the primary test interface board when the alternate primary product board is selectively coupled to the primary interface board instead of the first primary product board.

In Example 20, the subject matter of Example 18 can optionally include further comprising a first removable auxiliary test interface board which is selectively and removably coupled to the primary test interface board, the first auxiliary test interface board having test circuitry for testing the integrated circuit device disposed on the first primary product board, wherein the first auxiliary test interface board and the primary test interface board each have board connectors wherein the first auxiliary test interface board is selectively connected to and disconnected from the primary test interface board, the test interface device further comprising an alternate removable auxiliary test interface board for selectively and removably coupling to the primary interface board instead of the first primary test interface board, the alternate removable auxiliary test interface board having test circuitry for testing the integrated circuit device disposed on the first primary product board when the alternate auxiliary test interface board is selectively coupled to the primary interface board instead of the first auxiliary test interface board.

In Example 21, the subject matter of Example 20 can optionally include further comprising a cable coupled between the first auxiliary test interface board and the first primary product board, for forwarding test signals from the test circuitry of first removable auxiliary test interface board to the first primary product board.

In Example 22, the subject matter of Example 18 can optionally include further comprising a first removable auxiliary product board which is selectively and removably coupled to the first primary product board, the first auxiliary product board having test circuitry for testing the integrated circuit device disposed on the first primary product board, wherein the first auxiliary product board and the first primary product board each have board connectors wherein the first auxiliary product board is selectively connected to and disconnected from the first primary product board, the test interface device further comprising an alternate removable auxiliary product board for selectively and removably coupling to the first primary product board instead of the first auxiliary product board, the alternate removable auxiliary product board having test circuitry for testing the integrated circuit device disposed on the first primary product board when the alternate auxiliary product board is selectively coupled to the first primary product board instead of the first auxiliary product board.

In Example 23, the subject matter of Example 18 can optionally include wherein the primary test interface board is a first printed circuit board, the primary product board is a second printed circuit board having an integrated circuit socket disposed on the second printed circuit board, and is adapted to receive and electrically couple to an integrated circuit device to be tested.

In Example 24, the subject matter of Example 23 can optionally include wherein the first printed circuit board of the primary interface board defines an opening and the second printed circuit board of the primary product board is received in and substantially coplanar with the opening of the first printed circuit board.

In Example 25, the subject matter of Example 20 can optionally include wherein the test circuit of the first auxiliary test interface board comprises at least one of a relay loopback circuit, a relay and repeater loopback circuit, logic circuitry, dual mode test circuitry, and analog switch matrix circuitry.

Example 26 is a test interface device for use with a test controller means for generating and receiving test signals for testing an integrated circuit device, comprising: a primary test interface board means for forwarding test signals from the test controller means, and receiving test response signals and forwarding received test response signals to the test controller means; and a first removable primary product board means selectively and removably coupled to the primary test interface board means, for supporting the integrated circuit device, and for forwarding test signals from the primary test interface board means to the integrated circuit device and for receiving test response signals from the integrated circuit device and forwarding received test response signals to the primary test interface board means.

In Example 27, the subject matter of Example 26 can optionally include wherein the first primary product board means and the primary test interface board means each have board connector means wherein the first primary product board means is selectively connected to and disconnected from the primary test interface board means, the test interface device further comprising an alternate removable primary product board means for selectively coupling to the primary interface board means instead of the first primary product board means, the alternate removable primary product board means for supporting a second integrated circuit device, and for forwarding test signals from the primary test interface board means to the second integrated circuit device and for receiving test response signals from the second integrated circuit device and forwarding received test response signals to the primary test interface board means when the alternate primary product board means is selectively coupled to the primary interface board means instead of the first primary product board means.

In Example 28, the subject matter of Example 26 can optionally include further comprising a first removable auxiliary test interface board means which is selectively and removably coupled to the primary test interface board means, the first auxiliary test interface board means having test circuitry for testing the integrated circuit device disposed on the first primary product board means, wherein the first auxiliary test interface board means and the primary test interface board means each have board means connectors wherein the first auxiliary test interface board means is selectively connected to and disconnected from the primary test interface board means, the test interface device further comprising an alternate removable auxiliary test interface board means for selectively and removably coupling to the primary interface board means instead of the first primary test interface board means, the alternate removable auxiliary test interface board means having test circuitry for testing the integrated circuit device disposed on the first primary product board means when the alternate auxiliary test interface board means is selectively coupled to the primary interface board means instead of the first auxiliary test interface board means.

In Example 29, the subject matter of Example 28 can optionally include further comprising a cable coupled between the first auxiliary test interface board means and the first primary product board means, for forwarding test signals from the test circuitry of first removable auxiliary test interface board means to the first primary product board means.

In Example 30, the subject matter of Example 26 can optionally include further comprising a first removable auxiliary product board means which is selectively and removably coupled to the first primary product board means, the first auxiliary product board means having test circuitry for testing the integrated circuit device disposed on the first primary product board means, wherein the first auxiliary product board means and the first primary product board means each have board connectors wherein the first auxiliary product board means is selectively connected to and disconnected from the first primary product board means, the test interface device further comprising an alternate removable auxiliary product board means for selectively and removably coupling to the first primary product board means instead of the first auxiliary product board means, the alternate removable auxiliary product board means having test circuitry for testing the integrated circuit device disposed on the first primary product board means when the alternate auxiliary product board means is selectively coupled to the first primary product board means instead of the first auxiliary product board means.

In Example 31, the subject matter of Example 26 can optionally include wherein the primary test interface board means is a first printed circuit board means, the primary product board means is a second printed circuit board means having an integrated circuit socket disposed on the second printed circuit board means, and is adapted to receive and electrically couple to an integrated circuit device to be tested.

In Example 32, the subject matter of Example 23 can optionally include wherein the first printed circuit board means of the primary interface board means defines an opening and the second printed circuit board means of the primary product board means is received in and substantially coplanar with the opening of the first printed circuit board means.

In Example 33, the subject matter of Example 28 can optionally include wherein the test circuit of the first auxiliary test interface board means comprises at least one of a relay loopback circuit, a relay and repeater loopback circuit, logic circuitry means, dual mode test circuitry means, and analog switch matrix circuitry means.

Example 34 is a computer program product, comprising a computer readable storage medium having computer readable program code embodied therein executable by a processor to perform operations, the operations comprising: testing a first integrated circuit device using a test controller and a test interface coupled to the test controller, the first device testing comprising: using the test controller, generating test signals; and using a primary test interface board of the test interface, forwarding test signals from the test controller to a first removable primary product board of the test interface connected to the primary test interface board, the first primary product board having the first integrated circuit device under test disposed on the first primary product board, and forwarding test response signals from the first primary product board back to the test controller; and wherein the test interface may be reconfigured to test a second, different integrated circuit device.

In Example 35, the subject matter of Example 34, can optionally include wherein the reconfiguring comprises substituting an alternate removable primary product board for the first primary product board, said substituting comprising: removing the first primary product board from the primary test interface board and connecting a removable alternate primary product board to the primary test interface board instead of the first primary product board; and wherein the operations further comprise testing the second integrated circuit device using the test controller and the reconfigured test interface coupled to the test controller, the second device testing comprising: using the primary test interface board, forwarding test signals from the test controller to the alternate primary product board removably connected to the primary test interface board, the alternate primary product board having the second integrated circuit device under test disposed on the alternate primary product board, and forwarding test response signals from the alternate primary product board back to the test controller.

In Example 36, the subject matter of Example 34 can optionally include wherein the first device testing comprises: forwarding test signals from test circuitry of a first removable auxiliary test interface board connected to the primary test interface board, to the first primary product board, for testing the first integrated circuit device under test disposed on the first primary product board.

In Example 37, the subject matter of Example 35, can optionally include wherein the reconfiguring further comprises substituting an alternate removable auxiliary test interface board for the first auxiliary test interface board, said substituting comprising: removing the first auxiliary test interface board from the primary test interface board and connecting the alternate removable auxiliary test interface board to the primary test interface board instead of the first auxiliary test interface board; and wherein the operations further comprise forwarding test signals from test circuitry of the alternate auxiliary test interface board connected to the primary test interface board, to the alternate primary product board, for testing the second integrated circuit device under test disposed on the alternate primary product board.

In Example 38, the subject matter of Example 36 can optionally include wherein said forwarding from the first removable auxiliary test interface board comprises using a cable connected between the first removable auxiliary test interface board and the first primary product board to forward the test signals from test circuitry of the first removable auxiliary test interface board connected to the primary test interface board, to the first primary product board.

In Example 39, the subject matter of Example 34 can optionally include wherein the first device testing further comprises: using the first primary product board, forwarding test signals from test circuitry of a first removable auxiliary product board connected to the primary product board, for testing an integrated circuit device under test disposed on the first primary product board.

In Example 40, the subject matter of Example 39 can optionally include wherein the reconfiguring comprises substituting an alternate removable auxiliary product board for the first auxiliary product board, said substituting comprising: removing the first auxiliary product board from the primary product board and connecting the alternate removable auxiliary product board to the primary product board instead of the first auxiliary product board.

In Example 41, the subject matter of any one of Examples 1-2 can optionally include wherein the first device testing comprises: forwarding test signals from test circuitry of a first removable auxiliary test interface board connected to the primary test interface board, to the first primary product board, for testing the first integrated circuit device under test disposed on the first primary product board.

In Example 42, the subject matter of any one of Examples 1-2 and 41 can optionally include wherein the reconfiguring further comprises substituting an alternate removable auxiliary test interface board for the first auxiliary test interface board, said substituting comprising: removing the first auxiliary test interface board from the primary test interface board and connecting the alternate removable auxiliary test interface board to the primary test interface board instead of the first auxiliary test interface board; and wherein the method further comprises forwarding test signals from test circuitry of the alternate auxiliary test interface board connected to the primary test interface board, to the alternate primary product board, for testing the second integrated circuit device under test disposed on the alternate primary product board.

In Example 43, the subject matter of any one of Examples 1-2 and 41-42 can optionally include wherein said forwarding from the first removable auxiliary test interface board comprises using a cable connected between the first removable auxiliary test interface board and the first primary product board to forward the test signals from test circuitry of the first removable auxiliary test interface board connected to the primary test interface board, to the first primary product board.

In Example 44, the subject matter of any one of Examples 1-2 and 41-43 can optionally include wherein the first device testing further comprises: using the first primary product board, forwarding test signals from test circuitry of a first removable auxiliary product board connected to the primary product board, for testing an integrated circuit device under test disposed on the first primary product board.

In Example 45, the subject matter of any one of Examples 1-2 and 41-44 can optionally include wherein the reconfiguring comprises substituting an alternate removable auxiliary product board for the first auxiliary product board, said substituting comprising: removing the first auxiliary product board from the primary product board and connecting the alternate removable auxiliary product board to the primary product board instead of the first auxiliary product board.

In Example 46, the subject matter of any one of Examples 8-9 can optionally include wherein the test interface further comprises a first removable auxiliary test interface board which is selectively and removably coupled to the primary test interface board, the first auxiliary test interface board having test circuitry for testing the integrated circuit device disposed on the first primary product board.

In Example 47, the subject matter of any one of Examples 8-9 and 46 can optionally include wherein the first auxiliary test interface board and the primary test interface board each have board connectors wherein the first auxiliary test interface board is selectively connected to and disconnected from the primary test interface board, the test interface further comprising an alternate removable auxiliary test interface board for selectively and removably coupling to the primary interface board instead of the first primary test interface board, the alternate removable auxiliary test interface board having test circuitry for testing the integrated circuit device disposed on the first primary product board when the alternate auxiliary test interface board is selectively coupled to the primary interface board instead of the first auxiliary test interface board.

In Example 48, the subject matter of any one of Examples 8-9 and 46-47 can optionally include wherein the primary test interface board has routing circuitry for forwarding test signals from the test circuitry of the first auxiliary test interface board to the first primary product board.

In Example 49, the subject matter of any one of Examples 8-12 and 45-48 can optionally include wherein the test interface further comprising a cable coupled between the first auxiliary test interface board and the first primary product board, for forwarding test signals from the test circuitry of first removable auxiliary test interface board to the first primary product board.

In Example 50, the subject matter of any one of Examples 8-9 and 46-49 can optionally include wherein the test interface further comprises a first removable auxiliary product board which is selectively and removably coupled to the first primary product board, the first auxiliary product board having test circuitry for testing the integrated circuit device disposed on the first primary product board, wherein the first auxiliary product board and the first primary product board each have board connectors wherein the first auxiliary product board is selectively connected to and disconnected from the first primary product board, the test interface further comprising an alternate removable auxiliary product board for selectively and removably coupling to the first primary product board instead of the first auxiliary product board, the alternate removable auxiliary product board having test circuitry for testing the integrated circuit device disposed on the first primary product board when the alternate auxiliary product board is selectively coupled to the first primary product board instead of the first auxiliary product board.

In Example 51, the subject matter of any one of Examples 8-9 and 46-50 can optionally include wherein the primary test interface board is a first printed circuit board, and the primary product board is a second printed circuit board having an integrated circuit socket disposed on the second printed circuit board, and is adapted to receive and electrically couple to an integrated circuit device to be tested.

In Example 52, the subject matter of any one of Examples 8-9 and 46-51 can optionally include wherein the first printed circuit board of the primary interface board defines an opening and the second printed circuit board of the primary product board is received in and substantially coplanar with the opening of the first printed circuit board.

In Example 53, the subject matter of any one of Examples 8-9 and 46-52 can optionally include wherein the test circuit of the first auxiliary test interface board comprises at least one of a relay loopback circuit, a relay and repeater loopback circuit, logic circuitry, dual mode test circuitry, and analog switch matrix circuitry.

In Example 54, the subject matter of any one of Examples 18-19 can optionally include further comprising a first removable auxiliary test interface board which is selectively and removably coupled to the primary test interface board, the first auxiliary test interface board having test circuitry for testing the integrated circuit device disposed on the first primary product board, wherein the first auxiliary test interface board and the primary test interface board each have board connectors wherein the first auxiliary test interface board is selectively connected to and disconnected from the primary test interface board, the test interface device further comprising an alternate removable auxiliary test interface board for selectively and removably coupling to the primary interface board instead of the first primary test interface board, the alternate removable auxiliary test interface board having test circuitry for testing the integrated circuit device disposed on the first primary product board when the alternate auxiliary test interface board is selectively coupled to the primary interface board instead of the first auxiliary test interface board.

In Example 55, the subject matter of any one of Examples 18-19 and 54 can optionally include further comprising a cable coupled between the first auxiliary test interface board and the first primary product board, for forwarding test signals from the test circuitry of first removable auxiliary test interface board to the first primary product board.

In Example 56, the subject matter of any one of Examples 18-19 and 54-55 can optionally include further comprising a first removable auxiliary product board which is selectively and removably coupled to the first primary product board, the first auxiliary product board having test circuitry for testing the integrated circuit device disposed on the first primary product board, wherein the first auxiliary product board and the first primary product board each have board connectors wherein the first auxiliary product board is selectively connected to and disconnected from the first primary product board, the test interface device further comprising an alternate removable auxiliary product board for selectively and removably coupling to the first primary product board instead of the first auxiliary product board, the alternate removable auxiliary product board having test circuitry for testing the integrated circuit device disposed on the first primary product board when the alternate auxiliary product board is selectively coupled to the first primary product board instead of the first auxiliary product board.

In Example 57, the subject matter of any one of Examples 18-19 and 54-56 can optionally include wherein the primary test interface board is a first printed circuit board, the primary product board is a second printed circuit board having an integrated circuit socket disposed on the second printed circuit board, and is adapted to receive and electrically couple to an integrated circuit device to be tested.

In Example 58, the subject matter of any one of Examples 18-19 and 54-57 can optionally include wherein the first printed circuit board of the primary interface board defines an opening and the second printed circuit board of the primary product board is received in and substantially coplanar with the opening of the first printed circuit board.

In Example 59, the subject matter of any one of Examples 18-19 and 54-58 can optionally include wherein the test circuit of the first auxiliary test interface board comprises at least one of a relay loopback circuit, a relay and repeater loopback circuit, logic circuitry, dual mode test circuitry, and analog switch matrix circuitry.

In Example 60, the subject matter of any one of Examples 26-27 can optionally include further comprising a first removable auxiliary test interface board means which is selectively and removably coupled to the primary test interface board means, the first auxiliary test interface board means having test circuitry for testing the integrated circuit device disposed on the first primary product board means, wherein the first auxiliary test interface board means and the primary test interface board means each have board means connectors wherein the first auxiliary test interface board means is selectively connected to and disconnected from the primary test interface board means, the test interface device further comprising an alternate removable auxiliary test interface board means for selectively and removably coupling to the primary interface board means instead of the first primary test interface board means, the alternate removable auxiliary test interface board means having test circuitry for testing the integrated circuit device disposed on the first primary product board means when the alternate auxiliary test interface board means is selectively coupled to the primary interface board means instead of the first auxiliary test interface board means.

In Example 61, the subject matter of any one of Examples 26-27 and 60 can optionally include further comprising a cable coupled between the first auxiliary test interface board means and the first primary product board means, for forwarding test signals from the test circuitry of first removable auxiliary test interface board means to the first primary product board means.

In Example 62, the subject matter of any one of Examples 26-27 and 60-61 can optionally include further comprising a first removable auxiliary product board means which is selectively and removably coupled to the first primary product board means, the first auxiliary product board means having test circuitry for testing the integrated circuit device disposed on the first primary product board means, wherein the first auxiliary product board means and the first primary product board means each have board connectors wherein the first auxiliary product board means is selectively connected to and disconnected from the first primary product board means, the test interface device further comprising an alternate removable auxiliary product board means for selectively and removably coupling to the first primary product board means instead of the first auxiliary product board means, the alternate removable auxiliary product board means having test circuitry for testing the integrated circuit device disposed on the first primary product board means when the alternate auxiliary product board means is selectively coupled to the first primary product board means instead of the first auxiliary product board means.

In Example 63, the subject matter of any one of Examples 26-27 and 60-62 can optionally include wherein the primary test interface board means is a first printed circuit board means, the primary product board means is a second printed circuit board means having an integrated circuit socket disposed on the second printed circuit board means, and is adapted to receive and electrically couple to an integrated circuit device to be tested.

In Example 64, the subject matter of any one of Examples 26-27 and 60-63 can optionally include wherein the first printed circuit board means of the primary interface board means defines an opening and the second printed circuit board means of the primary product board means is received in and substantially coplanar with the opening of the first printed circuit board means.

In Example 65, the subject matter of Example 26-27 and 60-634 can optionally include wherein the test circuit of the first auxiliary test interface board means comprises at least one of a relay loopback circuit, a relay and repeater loopback circuit, logic circuitry means, dual mode test circuitry means, and analog switch matrix circuitry means.

In Example 66, the subject matter of any one of Examples 34-35 can optionally include wherein the first device testing comprises: forwarding test signals from test circuitry of a first removable auxiliary test interface board connected to the primary test interface board, to the first primary product board, for testing the first integrated circuit device under test disposed on the first primary product board.

In Example 67, the subject matter of any one of Examples 34-35 and 66, can optionally include wherein the reconfiguring further comprises substituting an alternate removable auxiliary test interface board for the first auxiliary test interface board, said substituting comprising: removing the first auxiliary test interface board from the primary test interface board and connecting the alternate removable auxiliary test interface board to the primary test interface board instead of the first auxiliary test interface board; and wherein the operations further comprise forwarding test signals from test circuitry of the alternate auxiliary test interface board connected to the primary test interface board, to the alternate primary product board, for testing the second integrated circuit device under test disposed on the alternate primary product board.

In Example 68, the subject matter of any one of Examples 34-35 and 66-67 can optionally include wherein said forwarding from the first removable auxiliary test interface board comprises using a cable connected between the first removable auxiliary test interface board and the first primary product board to forward the test signals from test circuitry of the first removable auxiliary test interface board connected to the primary test interface board, to the first primary product board.

In Example 69, the subject matter of any one of Examples 34-35 and 66-68 can optionally include wherein the first device testing further comprises: using the first primary product board, forwarding test signals from test circuitry of a first removable auxiliary product board connected to the primary product board, for testing an integrated circuit device under test disposed on the first primary product board.

In Example 70, the subject matter of any one of Examples 34-35 and 66-69 can optionally include wherein the reconfiguring comprises substituting an alternate removable auxiliary product board for the first auxiliary product board, said substituting comprising: removing the first auxiliary product board from the primary product board and connecting the alternate removable auxiliary product board to the primary product board instead of the first auxiliary product board.

Example 71 is a computer program product, comprising a computer readable storage medium having computer readable program code embodied therein executable by a processor to perform the method of any one of Examples 1-2 and 41-45.

Example 72 is a computer program product, comprising a computer readable storage medium having computer readable program code embodied therein executable by a processor to implement a method or realize the apparatus of any one of the above Examples 1-70.

Additional Embodiment Details

The described techniques for may be embodied as a method, apparatus, computer program product or article of manufacture using standard programming and/or engineering techniques to produce software, firmware, hardware, or any combination thereof. The test circuits may include programmable processors, dedicated processors, comparators or adder/subtractor circuits. The test signals may be processed by on board logic circuitry, firmware or software or processed by off board logic circuitry, firmware or software, or a combination thereof. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" or "computer program product" may comprise the medium in which the code is embodied. Additionally, the "article of manufacture" "computer program product" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, a test interface in accordance with the present description, may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the test interface embodiments may be embodied in a computing device that does not include, for example, a video controller, such as a switch, router, etc., or does not include a network controller, for example.

The illustrated logic of figures may show certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 11:
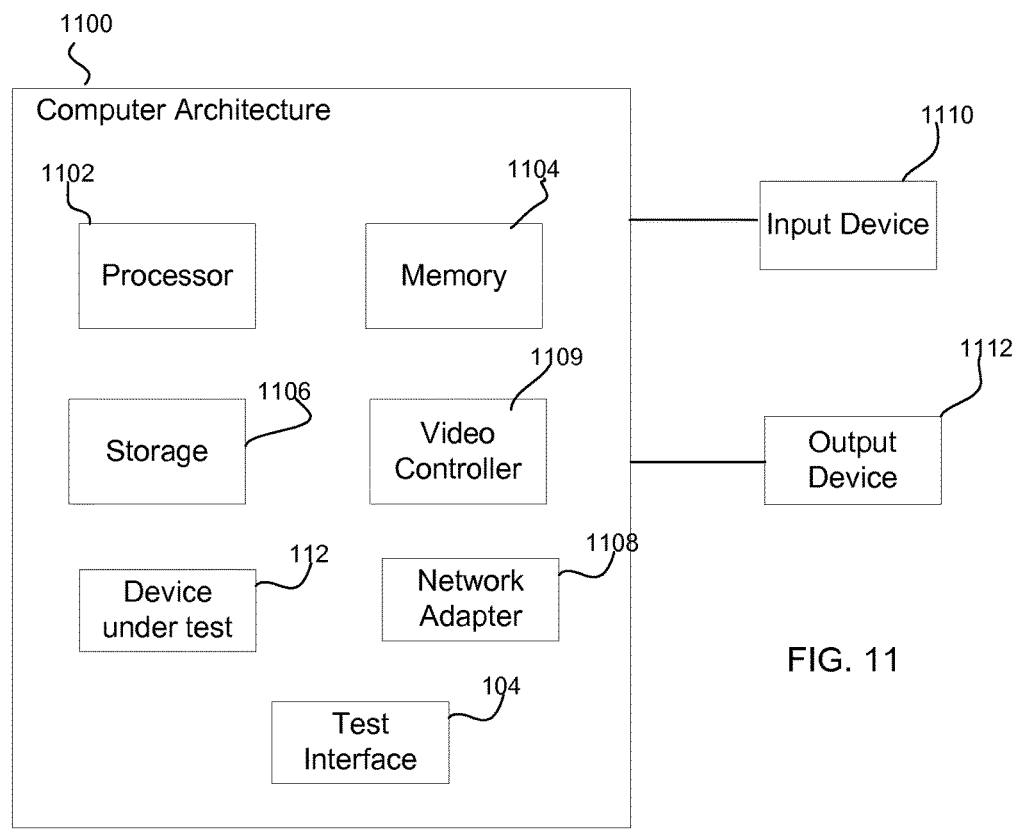
FIG. 11 illustrates one embodiment of a computer architecture of a test system for testing an integrated circuit device using a test interface in accordance with the present description.

FIG. 11 illustrates one embodiment of a computer architecture 1100 of a test system such as the test system 100 of FIG. 1, for testing an integrated circuit device 112 using a test interface 104 having a plurality of boards in accordance with the present description. The computer architecture 1100 may comprise any computing device known in the art, such as a mainframe, server, personal computer, workstation, laptop, handheld computer, telephony device, network appliance, virtualization device, storage controller, etc. The architecture 1100 may include a processor 1102 (e.g., a microprocessor), a memory 1104 (e.g., a volatile memory device), and storage 1106 (e.g., a non-volatile storage, such as magnetic disk drives, optical disk drives, a tape drive, etc.). The storage 1106 may comprise an internal storage device or an attached or network accessible storage. Programs in the storage 1106 are loaded into the memory 1104 and executed by the processor 1102 in a manner known in the art. The architecture further includes a network controller or adapter 1108 to enable communication with a network, such as an Ethernet, a Fibre Channel Arbitrated Loop, etc. Further, the architecture may, in certain embodiments, include a video controller 1109 to render information on a display monitor, where the video controller 1109 may be embodied on a video card or integrated on integrated circuit components mounted on the motherboard. An input device 1110 is used to provide user input to the processor 1102, and may include a keyboard, mouse, pen-stylus, microphone, touch sensitive display screen, or any other activation or input mechanism known in the art. An output device 1112 is capable of rendering information transmitted from the processor 1102, or other component, such as a display monitor, printer, storage, etc.

The network adapter 1108 may embodied on a network card, such as a Peripheral Component Interconnect (PCI) card, PCI-express, or some other I/O card, or on integrated circuit components mounted on the motherboard. The storage 1106 may comprise an internal storage device or an attached or network accessible storage. Programs in the storage 1106 are loaded into the memory 1104 and executed by the processor 1102. Any one or more of the devices of the computer architecture 1100 may include one or more integrated circuits having an on-die conversion testing circuit as described herein.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
    testing a first integrated circuit device using a test controller and a test interface coupled to the test controller, the first device testing comprising:
    using the test controller, generating test signals;
    using a primary test interface board of the test interface, forwarding test signals from the test controller to a first removable primary product board of the test interface connected to the primary test interface board by board edge connectors, the first removable primary product board having forwarding circuitry and having the first integrated circuit device under test disposed in a socket on the first removable primary product board, and forwarding test response signals from the first removable primary product board back to the test controller;
    forwarding test signals from test circuitry of a first removable auxiliary test interface board connected to the primary test interface board, to the first removable primary product board, for testing the first integrated circuit device under test disposed on the first removable primary product board;
    using the forwarding circuitry of the first removable primary product board, forwarding test signals from test circuitry of a first removable auxiliary product board connected to the first removable primary product board, for testing an integrated circuit device under test disposed on the first removable primary product board; and
    reconfiguring the test interface to test a second, different integrated circuit device.

2. The method of claim 1, wherein the reconfiguring comprises substituting an alternate removable primary product board for the first removable primary product board, said substituting comprising:
    removing the first removable primary product board from the primary test interface board and connecting an alternate removable primary product board to the primary test interface board instead of the first primary product board; and
    wherein the method further comprises testing the second integrated circuit device using the test controller and the reconfigured test interface coupled to the test controller, the second device testing comprising:
    using the forwarding circuitry of the primary test interface board, forwarding test signals from the test controller to the alternate removable primary product board removably connected to the primary test interface board, the alternate removable primary product board having forwarding circuitry and having the second integrated circuit device under test disposed on the alternate removable primary product board, and forwarding test response signals from the alternate removable primary product board back to the test controller.

3. The method of claim 2, wherein the reconfiguring further comprises substituting an alternate removable auxiliary test interface board for the first removable auxiliary test interface board, said substituting comprising:

removing the first removable auxiliary test interface board from the primary test interface board and connecting the alternate removable auxiliary test interface board to the primary test interface board instead of the first removable auxiliary test interface board; and wherein the method further comprises forwarding test signals from test circuitry of the alternate removable auxiliary test interface board connected to the primary test interface board, to the alternate removable primary product board, for testing the second integrated circuit device under test disposed on the alternate removable primary product board.

4. The method of claim 1 wherein said forwarding from the first removable auxiliary test interface board comprises using a cable connected between the first removable auxiliary test interface board and the first removable primary product board to forward the test signals from test circuitry of the first removable auxiliary test interface board connected to the primary test interface board, to the first removable primary product board.

5. The method of claim 1, wherein the reconfiguring comprises substituting an alternate removable auxiliary product board for the first auxiliary product board, said substituting comprising:

removing the first removable auxiliary product board from the first removable primary product board and connecting the alternate removable auxiliary product board to the first removable primary product board instead of the first removable auxiliary product board.

6. A system for testing an integrated circuit device, comprising:

a test controller for generating and receiving test signals; and a test interface adapted to be coupled between the test controller and the integrated circuit device, the test interface comprising:

a primary test interface board for forwarding test signals from the test controller, and receiving test response signals and forwarding received test response signals to the test controller;

a first removable primary product board having board edge connectors configured to selectively and removably couple the first removable primary product board to the primary test interface board, and having a socket configured for supporting and mechanically securing the integrated circuit device to the first removable primary product board, and having forwarding circuitry for forwarding test signals from the primary test interface board to the integrated circuit device and for receiving test response signals from the integrated circuit device and forwarding received test response signals to the primary test interface board;

a first removable auxiliary test interface board which is selectively and removably coupled to the primary test interface board, the first removable auxiliary test interface board having test circuitry for testing the integrated circuit device when secured to the first removable primary product board wherein the first removable auxiliary test interface board and the primary test interface board each have board connectors wherein the first removable auxiliary test interface board is selectively connected to and disconnected from the primary test interface board; and a first removable auxiliary product board which is selectively and removably coupled to the first removable primary product board, the first removable auxiliary product board having test circuitry for testing the integrated circuit device when secured to the first removable primary product board, wherein the first removable auxiliary product board and the first primary product board each have board connectors wherein the first removable auxiliary product board is selectively connected to and disconnected from the first removable primary product board.

7. The system of claim 6, wherein the first removable primary product board and the primary test interface board each have board connectors wherein the first removable primary product board is selectively connected to and disconnected from the primary test interface board, the test interface further comprising an alternate removable primary product board for selectively coupling to the primary interface board instead of the first removable primary product board, the alternate removable primary product board having a mechanical coupler configured for supporting and mechanically securing a second integrated circuit device to the alternate removable primary product board, and having forwarding circuitry for forwarding test signals from the primary test interface board to the second integrated circuit, receiving test response signals from the second integrated circuit device and forwarding received test response signals to the primary test interface board when the alternate removable primary product board is selectively coupled to the primary interface board instead of the first removable primary product board.

8. The system of claim 6, wherein the test interface further comprises an alternate removable auxiliary test interface board for selectively and removably coupling to the primary interface board instead of the first primary test interface board, the alternate removable auxiliary test interface board having test circuitry for testing the integrated circuit device when secured to the first removable primary product board and when the alternate removable auxiliary test interface board is selectively coupled to the primary interface board instead of the first removable auxiliary test interface board.

9. The system of claim 6 wherein the primary test interface board has routing circuitry for forwarding test signals from the test circuitry of the first removable auxiliary test interface board to the first removable primary product board.

10. The system of claim 6 wherein the test interface further comprising a cable coupled between the first removable auxiliary test interface board and the first removable primary product board, for forwarding test signals from the test circuitry of first removable auxiliary test interface board to the first removable primary product board.

11. The system of claim 6 wherein the test interface further comprises an alternate removable auxiliary product board for selectively and removably coupling to the first primary product board instead of the first auxiliary product board, the alternate removable auxiliary product board having test circuitry for testing the integrated circuit device when secured to the first removable primary product board when the alternate removable auxiliary product board is selectively coupled to the first removable primary product board instead of the first removable auxiliary product board.

12. The system of claim 6 wherein the primary test interface board includes a first printed circuit board, and the first removable primary product board includes a second printed circuit board, wherein the socket is an integrated circuit socket disposed on the second printed circuit board, and is adapted to receive and electrically and mechanically couple to an integrated circuit device to be tested.

13. The system of claim 12 wherein the first printed circuit board of the primary interface board defines an opening and the second printed circuit board of the first removable primary product board is received in and substantially coplanar with the opening of the first printed circuit board.

14. The system of claim 6 wherein the test circuit of the first removable auxiliary test interface board comprises at least one of a relay loopback circuit, a relay and repeater loopback circuit, logic circuitry, dual mode test circuitry, and analog switch matrix circuitry.

15. A test interface device for use with a test controller for generating and receiving test signals for testing an integrated circuit device, comprising:
   a primary test interface board for forwarding test signals from the test controller, and receiving test response signals and forwarding received test response signals to the test controller; and
   a first removable primary product board having board edge connectors configured to selectively and removably couple the first removable primary product board to the primary test interface board, and having a socket configured for supporting and mechanically securing the integrated circuit device to the first removable primary product board, and having forwarding circuitry for forwarding test signals from the primary test interface board to the integrated circuit device and for receiving test response signals from the integrated circuit device and forwarding received test response signals to the primary test interface board; and
   a first removable auxiliary test interface board which is selectively and removably coupled to the primary test interface board, the first removable auxiliary test interface board having test circuitry for testing the integrated circuit device when secured to the first removable primary product board, wherein the first removable auxiliary test interface board and the primary test interface board each have board connectors wherein the first removable auxiliary test interface board is selectively connected to and disconnected from the primary test interface board, and
   a first removable auxiliary product board which is selectively and removably coupled to the first removable primary product board, the first removable auxiliary product board having test circuitry for testing the integrated circuit device when secured the first removable primary product board wherein the first removable auxiliary product board and the first removable primary product board each have board connectors wherein the first removable auxiliary product board is selectively connected to and disconnected from the first removable primary product board.

16. The test interface device of claim 15 wherein the first removable primary product board and the primary test interface board each have board edge connectors wherein the first primary product board is selectively connected to and disconnected from the primary test interface board,
   the test interface device further comprising an alternate removable primary product board for selectively coupling to the primary interface board instead of the first removable primary product board, the alternate removable primary product board having a mechanical coupler configured for supporting and mechanically securing a second integrated circuit device to the alternate removable primary product board, and having forwarding circuitry for forwarding test signals from the primary test interface board to the second integrated circuit device, receiving test response signals from the second integrated circuit device and forwarding received test response signals to the primary test interface board when the alternate removable primary product board is selectively coupled to the primary interface board instead of the first removable primary product board.

17. The test interface device of claim 15 further comprising an alternate removable auxiliary test interface board for selectively and removably coupling to the primary test interface board instead of the first removable auxiliary test interface board, the alternate removable auxiliary test interface board having test circuitry for testing the integrated circuit device when secured to the first removable primary product board when the alternate removable auxiliary test interface board is selectively coupled to the primary interface board instead of the first removable auxiliary test interface board.

18. The test interface device of claim 17 further comprising a cable coupled between the first removable auxiliary test interface board and the first removable primary product board, for forwarding test signals from the test circuitry of the first removable auxiliary test interface board to the first removable primary product board.

19. The test interface device of claim 15 further comprising an alternate removable auxiliary product board for selectively and removably coupling to the first removable primary product board instead of the first removable auxiliary product board, the alternate removable auxiliary product board having test circuitry for testing the integrated circuit device when secured to the first removable primary product board when the alternate removable auxiliary product board is selectively coupled to the first removable primary product board instead of the first removable auxiliary product board.

20. The test interface device of claim 15 wherein the primary test interface board includes a first printed circuit board, the first removable primary product board includes a second printed circuit board, wherein the socket is an integrated circuit socket disposed on the second printed circuit board, and is adapted to receive and electrically and mechanically couple to an integrated circuit device to be tested.

21. The test interface device of claim 20 wherein the first printed circuit board of the primary interface board defines an opening and the second printed circuit board of the first removable primary product board is received in and substantially coplanar with the opening of the first printed circuit board.

22. The test interface device of claim 17 wherein the test circuit of the first removable auxiliary test interface board comprises at least one of a relay loopback circuit, a relay and repeater loopback circuit, logic circuitry, dual mode test circuitry, and analog switch matrix circuitry.

* * * * *